(12) United States Patent
Minemura et al.

(10) Patent No.: US 8,735,865 B2
(45) Date of Patent: May 27, 2014

(54) SEMICONDUCTOR MEMORY DEVICE

(75) Inventors: Hiroyuki Minemura, Kokubunji (JP); Yumiko Anzai, Saitama (JP); Takahiro Morikawa, Tsukuba (JP); Toshimichi Shintani, Kodaira (JP); Yoshitaka Sasago, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 512 days.

(21) Appl. No.: 12/987,109

(22) Filed: Jan. 8, 2011

(65) Prior Publication Data

US 2011/0235408 A1  Sep. 29, 2011

(30) Foreign Application Priority Data

Mar. 24, 2010  (JP) ................. 2010-067204

(51) Int. Cl.
*H01L 29/02* (2006.01)
*H01L 29/06* (2006.01)
*G11C 11/00* (2006.01)

(52) U.S. Cl.
USPC ............................................. 257/5

(58) Field of Classification Search
USPC ................. 365/148, 163; 257/2–5, 257/E29.002–E29.006, E27.004, E45.001, 257/E45.002
See application file for complete search history.

(56) References Cited

U.S. PATENT DOCUMENTS

| | | | | |
|---|---|---|---|---|
| 6,927,410 B2 * | 8/2005 | Chen | | 257/2 |
| 7,375,365 B2 * | 5/2008 | Hsiung | | 257/2 |
| 7,463,512 B2 * | 12/2008 | Lung | | 365/163 |
| 7,678,606 B2 * | 3/2010 | Chen | | 438/102 |
| 7,851,778 B2 * | 12/2010 | Kang et al. | | 257/4 |
| 7,888,155 B2 * | 2/2011 | Chen | | 438/54 |
| 8,115,239 B2 | 2/2012 | Lankhorst et al. | | |
| 8,173,987 B2 * | 5/2012 | Lung | | 257/2 |
| 8,410,468 B2 * | 4/2013 | Zheng | | 257/2 |
| 2006/0278900 A1 * | 12/2006 | Chang et al. | | 257/248 |
| 2007/0170413 A1 * | 7/2007 | Matsui et al. | | 257/3 |
| 2008/0149913 A1 | 6/2008 | Tanaka et al. | | |
| 2011/0049454 A1 | 3/2011 | Terao et al. | | |

FOREIGN PATENT DOCUMENTS

| | | |
|---|---|---|
| JP | 2007-531260 A | 11/2007 |
| JP | 2008-160004 A | 7/2008 |
| JP | 2009-117854 A | 5/2009 |
| WO | WO 2007148405 A1 | 12/2007 |

OTHER PUBLICATIONS

D. Adler et al. "Threshold Switching in Chalcogenide-Glass Thin Films", J. Appl. Phys. 51(6), Jun. 1980, pp. 3289-3309.

* cited by examiner

*Primary Examiner* — Allison P Bernstein
(74) *Attorney, Agent, or Firm* — Miles & Stockbridge P.C.

(57) ABSTRACT

For decreasing a recording current and suppressing a cross erase simultaneously, a three-dimensional phase-change memory for attaining higher sensitivity and higher reliability by the provision of a chalcogenide type interface layer is provided, in which an electric resistivity, a thermal conductivity, and a melting point of the material of the interface layer are selected appropriately, thereby improving the current concentration to the phase-change material and thermal and material insulation property with Si channel upon writing.

9 Claims, 32 Drawing Sheets

FIG. 7
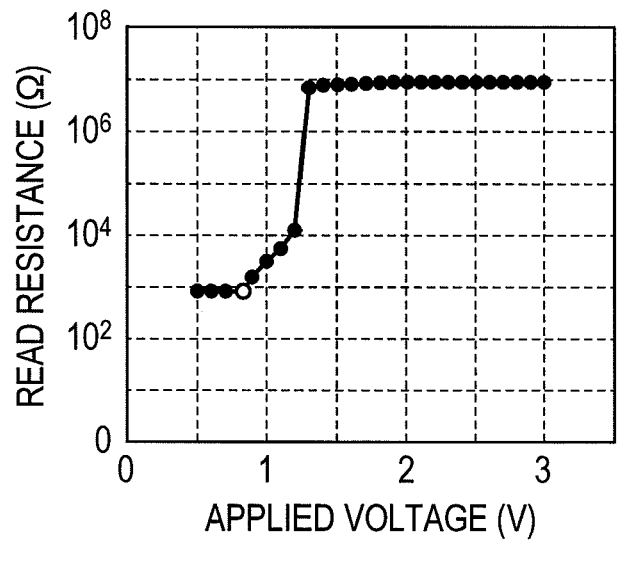
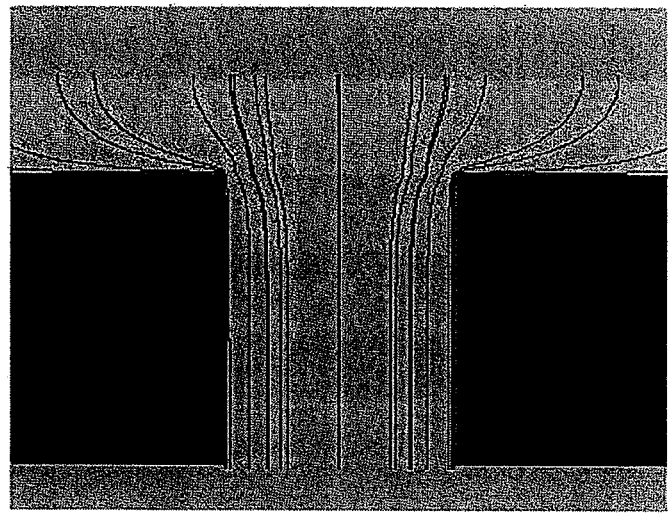
φ=0.8V R=0.87kΩ

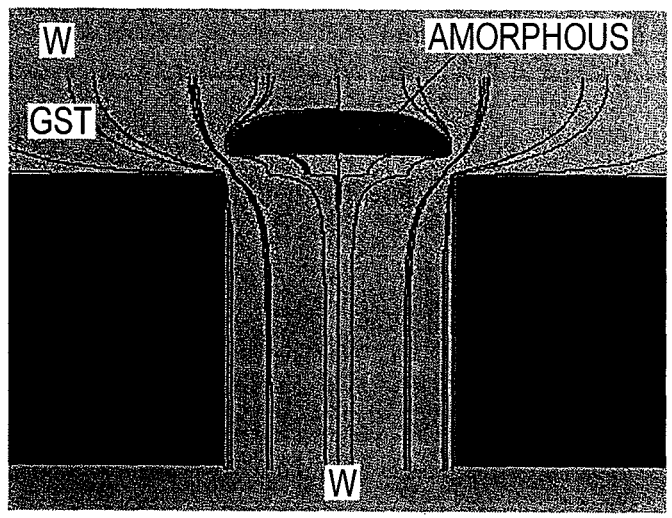

FIG. 9
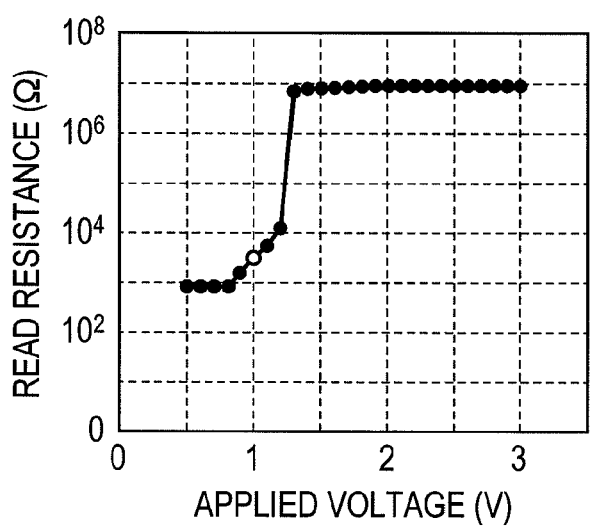
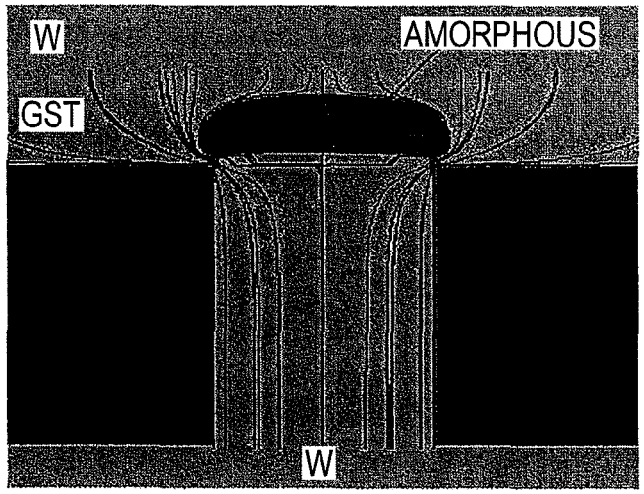

FIG. 10
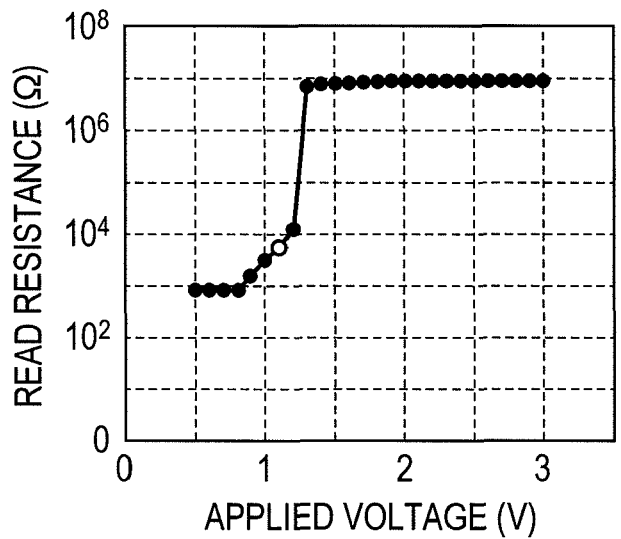
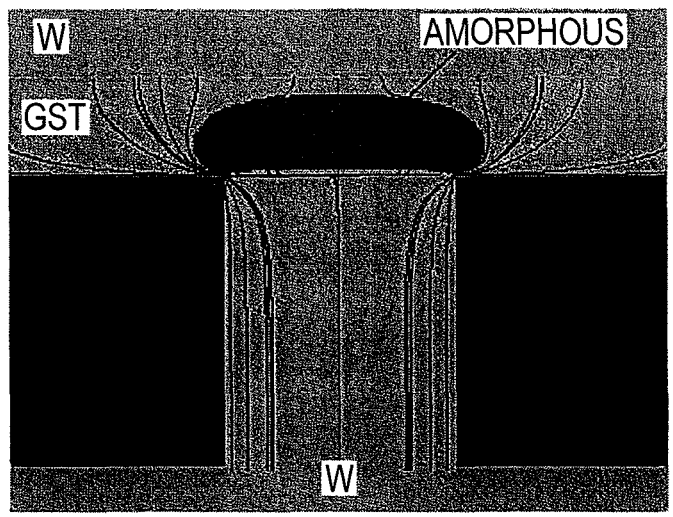

FIG. 11
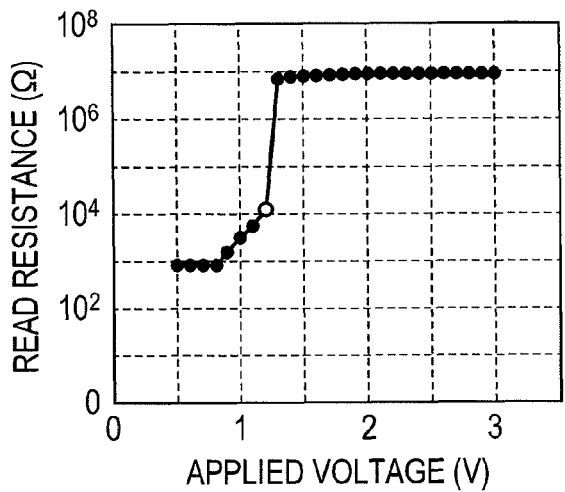
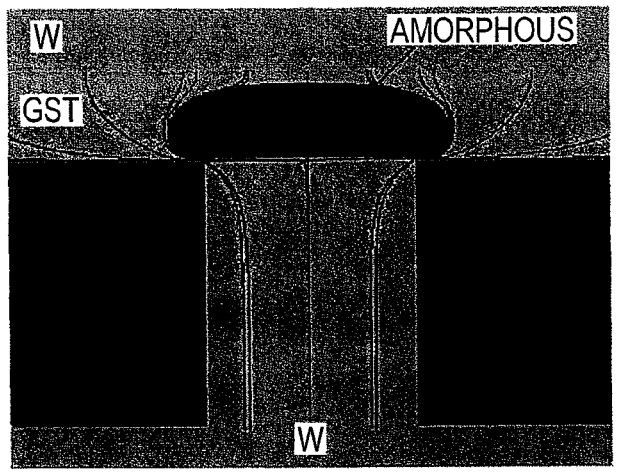
φ=1.2V R=14kΩ

FIG. 12 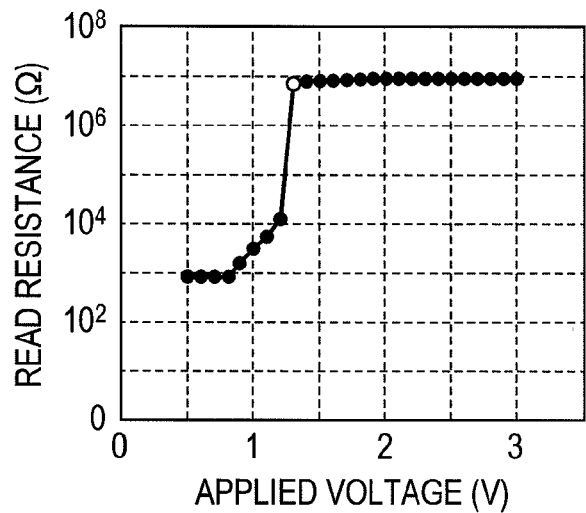 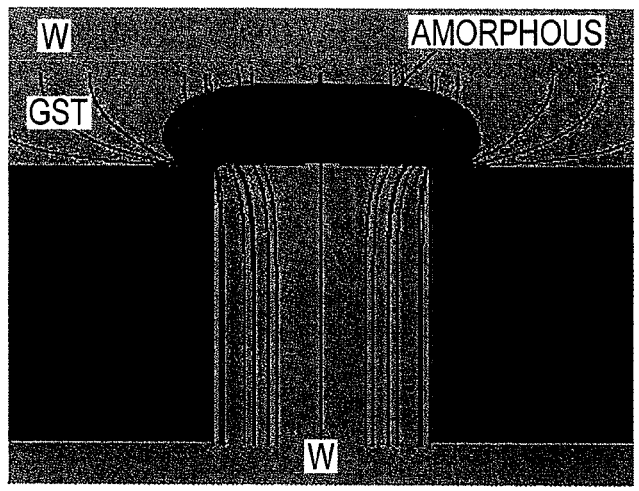

FIG. 13
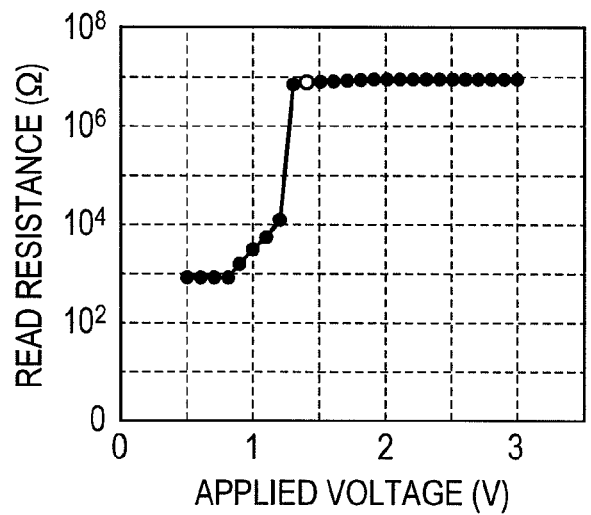
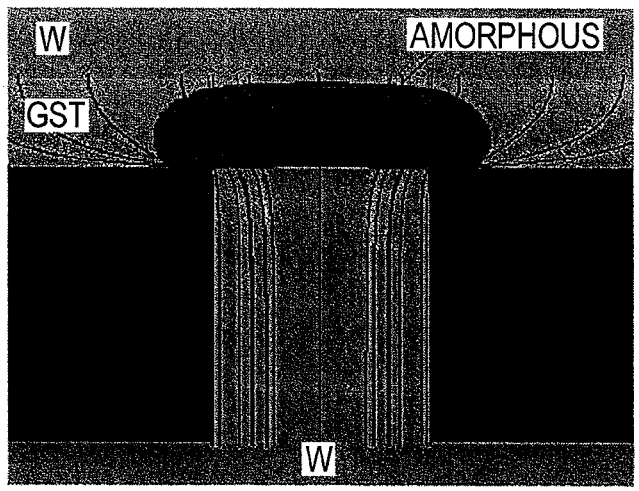
φ=1.4V  R=7600kΩ

FIG. 14 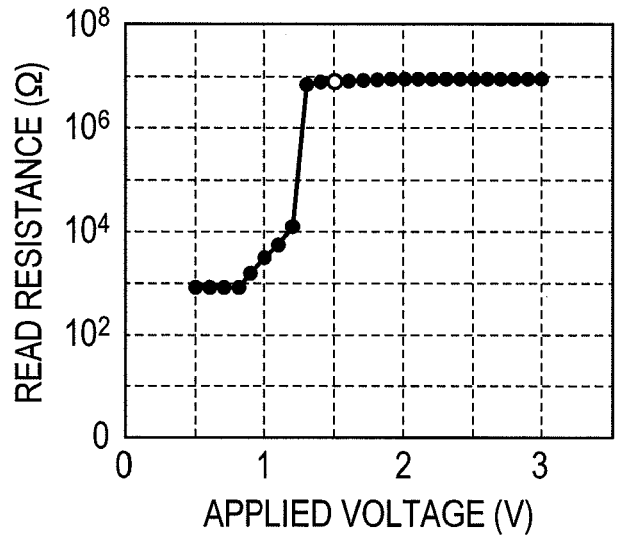 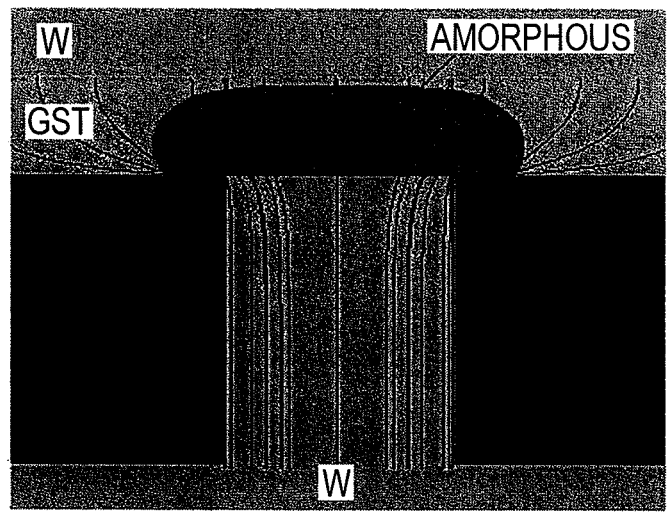

FIG. 15
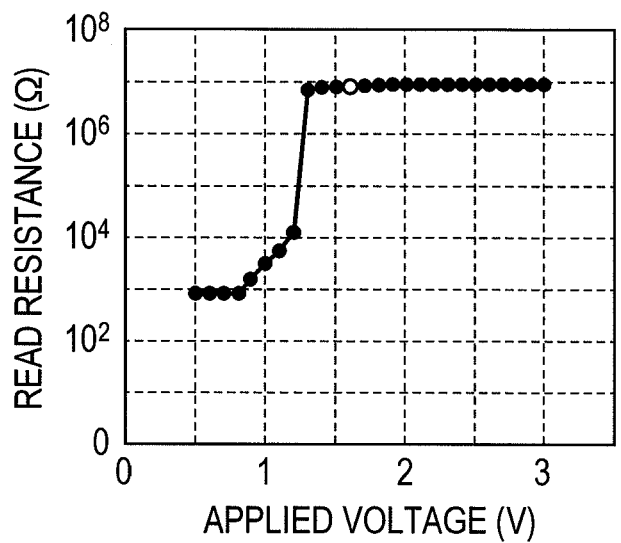
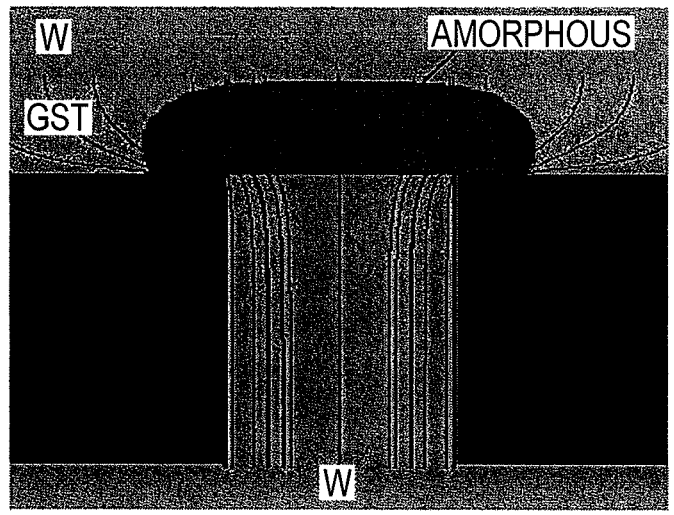
$\phi$=1.6V  R=8100k$\Omega$

FIG. 17

| TYPE | MATERIAL | ELECTRIC CONDUCTIVITY (S/m) | THERMAL CONDUCTIVITY (W/m·K) | NOTE |
|---|---|---|---|---|
| RECORDING MATERIAL | $Ge_2Sb_2Te_5$ | $9.5 \times 10^4$ | 0.58 | CRYSTAL |
| SEMICONDUCTOR | POLY-Si | $1.4 \times 10^5$ | 90 | ($Nd = 10^{20}$) 300K |
| | Si | $2.5 \times 10^4$ | 148 | 300K |
| HEATER MATERIAL | C | $6.1 \times 10^4$ | 129 | |
| | W | $1.9 \times 10^7$ | 177 | |
| | Mo | $1.9 \times 10^7$ | 138 | |
| | TiN | $9.5 \times 10^5$ | 35 | |
| INTERFACE LAYER | InSb | $1.9 \times 10^1$ | 0.55 | |
| | Te | $3.2 \times 10^3$ | 0.50 | |
| | $Si_{75}Sb_{25}$ | $9.5 \times 10^2$ | 0.5 | THERMAL CONDUCTIVITY: FORECAST VALUE |
| | $Si_{75}Bi_{25}$ | $2.7 \times 10^3$ | 0.5 | |
| | SiCr | $7.4 \times 10^5$ | 0.5 | |
| | $Si_2Te_3$ | $1.1 \times 10^3$ | 0.5 | |
| | $Si_{25}Te_{75}$ | $1.3 \times 10^3$ | 0.5 | |
| | $Si_{50}Te_{50}$ | $3.8 \times 10^{-1}$ | 0.5 | |
| | $Si_{75}Te_{25}$ | $1.8 \times 10^{-1}$ | 0.5 | |
| | CrTe | $3.1 \times 10^5$ | 0.5 | |

OUTER HEATER STRUCTURE

RESULT OF SIMULATION
Ith=1400μA
Vth=0.3V
R=0.19kΩ

| MATERIAL | ANGLE OF CONTACT WITH PURE WATER (DEGREE) | SURFACE ENERGY CALCULATION VALUE (mJ/m$^2$) | INTERFACIAL ENERGY WITH RECORDING FILM (mJ/m$^2$) |
|---|---|---|---|
| $Ge_2Sb_2Te_5$ | 48 | 185.6 | 0 |
| $SiO_2$ | 5 | 265.4 | 7.13 |
| $Cr_2O_3$ | 30 | 231.9 | 2.58 |
| $ZrO_2$ (+3% $Y_2O_3$) | 52 | 173.9 | 0.19 |
| $ZrO_2$ | 89 | 36 | 28.3 |
| $Si_2Te_3$ | 41 | 205.1 | 0.49 |
| SiSb | 42 | 202.4 | 0.37 |
| AlTiN | 59 | 152.9 | 1.58 |
| $ZnS-SiO_2$ | 20 | 250.6 | 4.88 |

IN A CASE WHERE THE THICKNESS OF INTERFACE LAYER IS THICK

IN A CASE WHERE THE THICKNESS OF INTERFACE LAYER IS THIN

BASIC STRUCTURE

ISOTROPIC THERMAL CONDITION

ANISOTROPIC THERMAL CONDUCTION 10%

8-14 MODULATION CODE

| NUMBER OF 1'S | NUMBER OF PATTERNS |
|---|---|
| 0 | 1 |
| 1 | 14 |
| 2 | 84 |
| 3 | 280 |
| 4 | 560 |
| 5 | 672 |
| 6 | 448 |
| 7 | 128 |
| 8 | 0 |
| 9 | 0 |
| 10 | 0 |
| 11 | 0 |
| 12 | 0 |
| 13 | 0 |
| 14 | 0 |

S/N RATIO AND BYTE ERROR RATE IN A CASE OF RANDOM NOISE

SEMICONDUCTOR MEMORY DEVICE

CLAIM OF PRIORITY

The present application claims priority from Japanese patent application JP 2010-067204 filed on Mar. 24, 2010, the content of which is hereby incorporated by reference into this application.

FIELD OF THE INVENTION

The present invention concerns a solid memory device and a recording method thereof and it particularly relates to a semiconductor memory device capable of rewriting for storing information by utilizing a material whose electric resistance changes reversibly by flowing a current to the device.

BACKGROUND OF THE INVENTION

In recent years, resistance change type memories have been studied as a substitute for flash memories which are now approaching the limit of refinement and, as an example, phase-change memories have been studied vigorously using chalcogenide materials as the recording material. In a basic structure of the phase-change memory, a recording material is put between metal electrodes. The phase-change memory is a resistance, change type solid memory for storing information by utilizing that the recording material between the electrodes has different states of resistance.

The phase-change memory stores information by utilizing that the resistance value of a phase-change material such as $Ge_2Sb_2Te_5$ is different between an amorphous state and a crystalline state. The resistance is high in the amorphous state and low in the crystalline state. Accordingly, reading is conducted by applying a potential difference across both ends of a device, measuring a current flowing through the device and judging whether the device is in a high resistance state or low resistance state.

In the phase-change memory, data is rewritten by changing the state of the phase-change film between the amorphous state and the crystalline state by the Joule heat generated by current. A reset operation, that is, the operation of changing the film to the amorphous state at a high resistance is conducted by flowing a relatively large current, to the phase-change film thereby melting the film and then quenching the same by rapidly decreasing the current. On the other hand, the setting operation, that is, the operation of changing the film to the crystalline state at a low resistance is conducted by flowing a relatively small current to the phase-change material and maintaining the material to a temperature higher than the temperature of crystallization. Since the volume of the phase-change material that changes the state is decreased by proceeding refinement and the necessary current is decreased, the phase-change memory is suitable to the refinement.

As a method of improving the integration degree of the phase-change memory, JP-A-2008-160004 discloses a technique of forming a plurality of through holes that pass through entire layers to a stack structure formed by alternately stacking gate electrode materials and insulating films each by plurality by corrective fabrication and depositing to fabricate a gate insulating film, a channel layer, and a phase-change film to the inner side of the through holes.

JP-A-2009-117854 discloses a technique of adding a resistance material such as TiN or C between metal electrodes and making it to act as a heater for decreasing the voltage which is necessary when the phase-change material is changed from the amorphous state to the crystalline state.

Change of the electric resistivity of the phase-change material in accordance with the temperature and the electric field intensity is explained in D. Adler et al., "Threshold Switching in Chalcogenide-Glass Thin Films". J. Appl. Phys. 51(6), pp. 3289-3309 (1980). Specifically, in the Non-Patent Document, in the phase-change material, the electric resistance changes by several digits in the amorphous state in accordance with the temperature and the electric field. This shows that the electric resistivity in the amorphous state changes greatly depending on the constitution of a device to be measured and the current cycle voltage conditions, etc. For avoiding misunderstanding caused by the change of the electric resistivity or the electroconductivity depending on such measuring conditions, description is to be made in the present specification while showing the resistivity and the conductivity as values in the crystalline state unless otherwise specified.

SUMMARY OF THE INVENTION

As has been described above, information is rewritten by using Joule heat generated by a flowing current different from other memories. Accordingly, it is important how to utilize the generated Joule heat.

At first, since rewriting is conducted in the phase-change memory by the Joule heat generated by flowing a current, the amount of current necessary for rewriting is generally ten times as large as that of a flash memory. Accordingly, the data transfer rate in a solid memory using the phase-change material is limited by a permissible combustion power. For improving the integration degree of the phase-change memory, a structure of a vertical memory described in JP-A-2008-160004 is effective. However, also in the vertical type memory, it is an important technique of reducing a necessary current for rewriting in order to improve the data transfer rate. For the improvement, when the technique of the heater layer described in JP-A-2009-117854 is introduced there, this imposes a problem that the voltage necessary for rewriting can be lowered but the current is increased contrarily. That is, according to the concept of JP-A-2009-117854, since the temperature of the phase-change material is increased by thermal diffusion due to the heat generation of TiN, it is necessary to flow the current concentrically to the TiN film and, as a result, the amount of the current is increased.

However, in the vertical type memory as described in JP-A-2008-160004, a thin Si film is used for introducing electric energy to a memory bit portion of the phase-change material. In the thin Si film, since the number of free electrons is smaller different from the metal material described in JP-A-2009-117854, it is important to decrease the write current rather than the writing voltage.

Secondly, although not described in the known documents, since the state of the this phase-change material film is changed by the temperature hysteresis in the phase-change memory, a phenomenon occurs inevitably in which the state of already written adjacent bits is changed from the amorphous state to the crystalline state by thermal diffusion upon rewriting one bit. The phenomenon is to be referred to as cross erase. Unless the cross erase is suppressed, the reliability of the phase-change memory device cannot be ensured. The cross erase is sometimes referred to as thermal disturb in a general meaning. While a solid state memory using a phase-change material comprises a thin semiconductor material film such as Si, an insulating material film such as $SiO_2$ and thin phase-change material film such as $Ge_2Sb_2Te_5$, since the thermal conductivity of such materials is predetermined, the distance between adjacent memory bits is decreased as refinement is progressed, so that cross erase tends to occur easily.

The present invention intends to solve the problems described above and provide a structure of a phase-change memory of a vertical type memory structure capable of attaining high speed transfer rate and high reliability by decreasing the write current or suppressing the cross erase, as well as a writing method thereof.

Summary of the principal of invention disclosed in the present specification for solving the problems described above is as follows.

In a first aspect of the invention, a semiconductor memory device comprises a stack in which a plurality of inter-gate insulating layers and a plurality of gate layers are stacked alternately, a channel layer formed along the lateral side of the stack, an interface layer formed along the lateral side of the channel layer and a phase-change material layer formed along the lateral side of the interface layer, in which the thermal conductivity of the interface layer is lower than the thermal conductivity of the channel layer, and the electric resistivity of the interface layer is higher than the electric resistivity of the phase-change material layer in the crystalline state.

Further, in a second aspect of the invention, the semiconductor memory device includes a phase-change material layer with a thickness of less than 4 nm and an interface layer formed so as to be in contact with the phase-change material and comprising one of an alloy system of Si and chalcogenide, a material system in which an oxide thereof forms a compound at the boundary relative to the phase-change material layer and oxygen of the oxide is substituted by Te, a metal oxide having an interfacial energy of 3 $mJ/m^2$ or less, and a metal nitride having an interfacial energy 3 $mJ/m^2$ or less.

Further, in a third aspect of the invention, a memory device includes a cell array having a stack in which a plurality of inter-gate layer insulating layers and a plurality of gate layers are stacked alternately, a channel layer formed along the lateral side of the stack, and a phase-change material layer formed along the lateral side of the channel layer, and a device controller that controls the voltage for each of the plurality of gate layers and supplies a current flowing by way of the channel layer to the phase-change material layer situated on the lateral side of each of the plurality of gate layers, thereby writing information, in which the device controller writes data successively from the upstream in the moving direction of the carriers in the channel portion.

Further, in a fourth aspect of the invention, a memory device includes:

a cell array having a first stack in which a plurality of first inter-gate insulating layers and a plurality of a first gate layers are stacked alternately, a second stack in which a plurality of second inter-gate insulating layers and a plurality of a second gate layers are stacked alternately, first channel layer formed along the lateral side of the first stack, a first phase-change layer formed along the lateral side of the first channel, a second channel layer formed along the lateral side of the second stack, a second phase-change layer formed along the lateral side of the second channel layer, and an insulating layer formed between the first phase-change material layer and the second phase-change material layer, a device controller that controls the voltage of each of the plurality of first and second gate layers and supplies a current flowing by way of the first and the second channel layers to the first and the second phase-change material layers situated on the lateral side of each of the plurality of first and second gate layers, and a codec that modulates information inputted from the outside and supplies the same to the device controller, in which each of the plurality of first gate layers and the first phase-change material layer situated on the lateral side of each of the plurality of first gate layers are paired to form a first bit, each of the plurality of second gate layers and the second phase-change material layer situated on the side of each of the plurality of second gate layers are paired to form a second bit in the cell array, and the codec modulates the information inputted from the outside such that the first and the second phase-change material layers corresponding to the first bit and the second bit situated at an identical height among the plurality of the first bits and the plurality of the second bits takes one of the states of crystalline state-crystalline state, crystalline state-amorphous state, and amorphous state-crystalline state.

According to the invention, it is possible to decrease the write current or improve the reliability of the phase-change memory of a vertical memory structure.

BRIEF DESCRIPTION OF THE DRAWINGS

FIG. 1 shows an example of a structure of a phase-change memory according to the invention in which

FIG. 2 shows another example of the phase-change memory according to the invention in which

FIG. 7 shows a relation between the shape and the electric resistance of amorphous formed in the plug device;

FIG. 9 shows a relation between the shape and the electric resistance of amorphous formed in the plug device;

FIG. 10 shows a relation between the shape and the electric resistance of amorphous formed in the plug device;

FIG. 11 shows a relation between the shape and the electric resistance of amorphous formed in the plug device;

FIG. 12 shows a relation between the shape and the electric resistance of amorphous formed in the plug device;

FIG. 13 shows a relation between the shape and the electric resistance of amorphous formed in the plug device;

FIG. 14 shows a relation between the shape and the electric resistance of amorphous formed in the plug device;

FIG. 15 shows a relation between the shape and the electric resistance of amorphous formed in the plug device;

FIG. 17 is a chart showing the electric conductivity and the thermal conductivity of various materials;

FIG. 34 explains the surface energy and the interfacial energy in which FIG. 34A schematically shows a measuring method for the angle of contact.

FIG. 35 shows a constitution for applying a metal oxide material to an interface layer in which

FIG. 36 shows the result of simulation taking the anisotropy of the thermal conductivity into consideration in which

DETAILED DESCRIPTION OF THE PREFERRED EMBODIMENTS

Figure 1A:
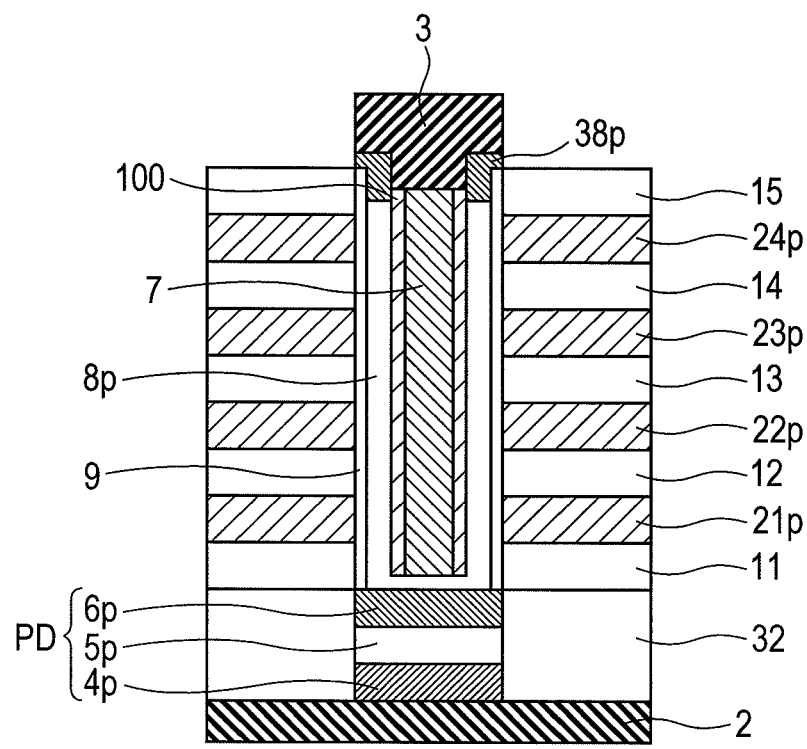
FIG. 1A is a vertical cross sectional view and FIG. 1B is a horizontal cross sectional view.

Preferred embodiments of the invention are to be described specifically with reference to the drawings. Throughout the entire drawings for explaining the examples, components having identical functions carry the same reference numerals for which duplicate descriptions are omitted. Further, those portions described for characteristic constitutions are not restricted to each of the embodiments but identical effects can be obtained in other cases where they have common constitutions.

Example 1

Figure 1B:
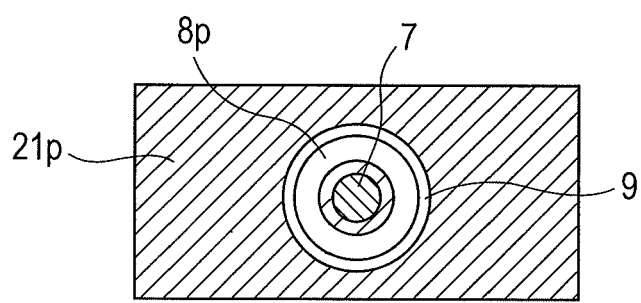

FIGS. 1A and 1B show an example of a model of a phase-change memory having a vertical memory structure. FIG. 1A is a cross sectional view in the vertical direction and FIG. 1B is a cross sectional view in a horizontal direction for a portion shown by a reference 21$p$. The drawing shows a phase-change memory material (phase-change-material layer) 7, an interface layer 100, and a channel polysilicon layer (channel layer) 8$p$ for flowing a write current. Further, gate polysilicon layers (gate layers) 21$p$, 22$p$, 23$p$, and 24$p$, and insulating film layers (inter-gate-layer insulating films) 11, 12, 13, 14, and 15 are formed alternately, and a channel polysilicon layer 8$p$, and a phase-change layer are disposed continuously on the lateral sides thereof. That is, the stack has a connection hole that connects the upper surface and the lower surface of the gate polysilicon layers 21$p$, 22$p$, 23$p$ and 24$p$, and the insulating film layers 11, 12, 13, 14, and 15 formed alternately, and the phase-change material layer 7 formed so as to cover the gate insulating film layer 9 and the gate insulating film layer 9 formed so as to cover the gate polysilicon layer and the insulating film layer are present on the lateral sides of the connection hole. In the phase-change memory of the vertical memory structure, each of the gate polysilicon layers 21$p$, 22$p$, 23$p$, and 24$p$ and the phase-change material layer 7 situated on each of the lateral sides of the gate polysilicon layers 21$p$, 22$p$, 23$p$, 24$p$ are paired to form one bit. That is, in the structure of FIG. 1, 4 bits are connected in series in the vertical direction to form one memory chain. Upon rewriting information, the information can be stored in the phase-change memory layer 7 by controlling the gate voltage on the gate polysilicon layer, decreasing the conductance of the channel polysilicon layer formed on the lateral side of the gate polysilicon layer, and supplying the current flowing through the channel polysilicon layer 8$p$ to the phase-change material layer 7 in a roundabout manner.

The structure can be attained by stacking the gate polysilicon layers 21$p$, 22$p$, 23$p$, and 24$p$, and the insulating film 11, 12, 13, 14, and 15 successively to form the stack, then forming connection hole connected to a diode PD to a portion of the stack after formation of the stack by etching or the like, and then forming the gate insulating film 9, the channel polysilicon layer 8$p$, the thin interface layer film 100, and the phase-change memory material 7 successively to the side wall of the connection hole. While the thin interface layer film 100 is separated from the bottom of the connection hole, it may be disposed onto the bottom. This is identical also in the structure of FIG. 2 to be described later.

Further, in the structure of FIG. 1, diodes 6$p$, 5$p$, 4$p$ of a P-i-N structure are present below the connection hole. The phase-change memory of the vertical memory structure is a so-called cross point memory cell where a memory chain is formed at the intersection between a word line 2 and a bit line 3. The diodes 6$p$, 5$p$, and 4$p$ have a role of a selection device that selects one memory chain among a plurality of memory chains disposed at the interconnections between a plurality of word lines and a plurality of bit lines. Connection 38$p$ connects channel layer 8$p$ and bit line 3.

According to the vertical type memory structure described above, as a number of the stack in the direction of the height increases, the number of the gate polysilicon layers covered by the gate insulating film layer 9 and the phase-change material layer 7 formed upon layer formation for once is increased. Accordingly, this has an effect of increasing the number of cells that can be formed at a time, compared with the case of forming the layer while dividing the gate insulating film 9 and the phase-change material layer 7 on every gate polysilicon layer and the bit cost can be decreased.

Another feature is that the phase-change material layer is formed so as to cover the channel layer (they are formed in the order of gate, channel, phase-change material layer). In the lateral memory cell chain structure, since the channel is formed in a substrate, the phase-change material layer has to be formed above the gate. Therefore, it has to divert the gate and a contact is necessary for connecting the channel layer and the phase-change material layer. On the other hand, in this example, the phase-change material layer is formed so as to cover the channel layer. Accordingly, it is not necessary to divert the gate and the structure can be made finer by saving the contact and this can decrease the bit cost.

Figure 2A:
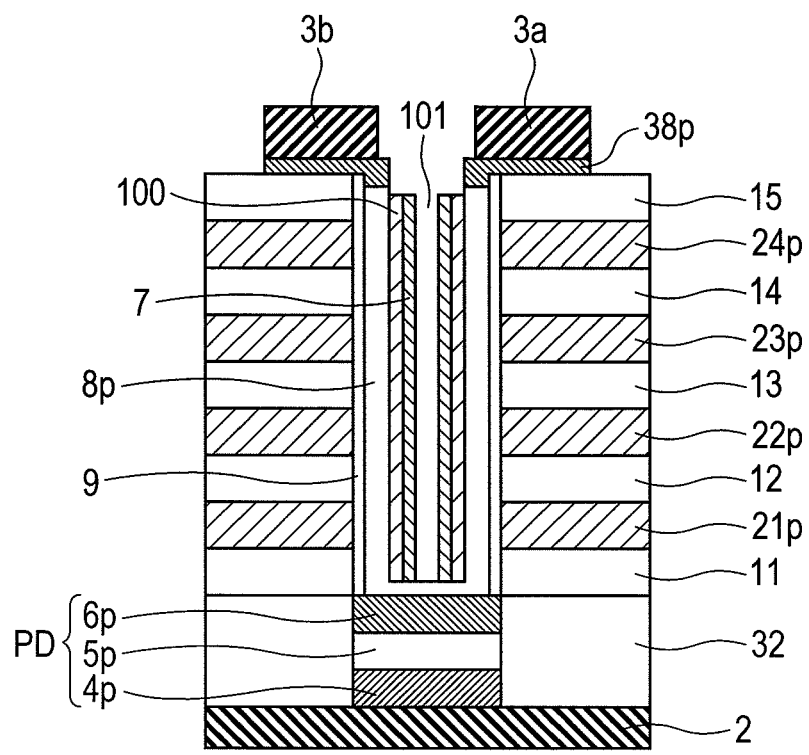
Figure 2B:
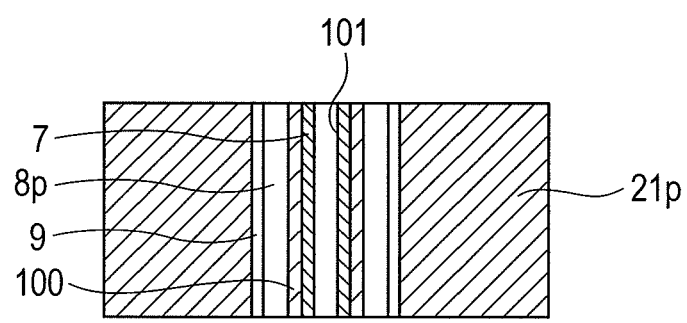

FIGS. 2A and 2B show another example of a model of a phase-change material layer of a vertical memory structure. In the same manner as in FIGS. 1A and 1B, FIG. 2A is a vertical cross sectional view and FIG. 2B is a horizontal cross sectional view for a portion shown by the reference 21p. This embodiment is different from the structure in FIG. 1 in that an $SiO_2$ material 101 is present which is disposed for thermal and electrical insulation between the phase-change materials and in that each of the phase-change materials 7 on the right and left of the $SiO_2$ material 101 can store the information independently. That is, while only one memory chain is provided to one connection hole in the structure of FIG. 1, two memory chains are formed to one connection hole in the structure of FIG. 2. This structure can further increase the memory capacity in one connection hole in addition to the effect of the structure described in FIG. 1.

Connection 38p connects channel layer 8p and bit line 3; bit lines 3a and 3b are also shown.

In the same manner as for the structure in FIG. 1, the structure in FIG. 2 can be obtained by forming a stack, conducting line and space fabrication in the direction perpendicular to the sheet of the drawing, forming a gate insulating film 9, a channel polysilicon layer 8p, an interface layer thin film 100, a phase-change memory material 7, and an $SiO_2$ material 101 in this order to the lateral side thereof, and then removing unnecessary channel polysilicon layer 8p, interface layer thin film 100, phase-change memory material 7, and $SiO_2$ material 101 by using the insulating film 15 above as a mask.

In the vertical memory structures shown in FIG. 1 and FIG. 2, the thickness of the insulating film layers 11, 12, 13, 14, and 15 may be decreased to less than that of the gate polysilicon layers 21p, 22p, 23p, and 24p. With the structure described above, since the length in the vertical direction can be shortened for the channel polysilicon layer 8p formed on the surface of the insulating film layers 11, 12, 13, 14, and 15 that less undergoes the effect of the gate voltage in the channel polysilicon layer 8p, it is possible to increase the conductance of the current path for the channel portion and conduct rewrite operation at a low current.

On the other hand, when the thickness of the insulating film layers 11, 12, 13, 14, and 15 is decreased excessively, since rewrite regions in the phase-change material layer 7 are close to each other, thermal disturb may be generated possibly between adjacent memory cells to each other. Accordingly, when the thickness for the insulating film layers 11, 12, 13, 14, and 15 is changed, increase of the channel conductance and the thermal disturb are in a trade off relation. In such a case, the channel layer situated between the gate polysilicon layers can be reversed intensely by using a material of high dielectric constant such as SiN for the insulating film layers 11, 12, 13, 14, and 15, so that the current in the channel layer increases without reducing the thickness of the insulating layers 11, 12, 13, 14, and 15 to conduct efficient rewrite operation. Needless to say, it is possible to decrease also the thickness of the insulating film layers 11, 12, 13, 14, and 15 to such an extent as not generating thermal disturb and using a material of high dielectric constant such as SiN for the insulating film.

Further, the structure shown in FIG. 1 and FIG. 2 has the interface layer 100 between the channel polysilicon layer 8p and the phase-change material layer 7. For the interface layer 100, those having an electric resistivity lower than the electric resistivity of the phase-change material layer in the crystalline state and having a thermal conductivity lower than the thermal conductivity of the semiconductor material (Si in this embodiment) constituting the channel layer (polysilicon channel 8p in this embodiment) that flows the current are preferred. This can obtain the effect of decreasing the write current in the structure where the thin Si film and the thin phase-change material film are in parallel resistance arrangement as in FIG. 1. The effect of decreasing the write current is to be described later. Further, it is desired that the melting point of the interface layer 100 is higher than the melting point of the phase-change material layer 7. Since the interface layer 100 is disposed in adjacent with the phase-change material layer 7, heat generated in the phase-change material layer 7 is transmitted directly thereto. However, when the melting point is higher than that of the phase-change material layer, the interface layer is not melted to suppress diffusion relative to other components.

Then, the effect of decreasing the write current of the interface layer 100 is to be described. For showing the advantage quantitatively, a simulator suitable to the analysis for characteristics of the vertical type memory is at first constituted, a guide line necessary for decreasing the write current of the phase-change memory is shown through the analysis for the result of a preliminary experiment, and the effectiveness of the vertical memory structure of the invention is to be shown quantitatively through the analysis thereof.

Generally, for the analysis of the write process of the phase-change memory, a Poisson equation or a Laplace equation is often used as a method for determining the current distribution. They are methods on the assumption that the current is 0 in a model in which an electric field distribution is calculated and then an electric conductivity is multiplied to the calculated value to determine the distribution of current flowing in the phase-change material and the generation of Joule heat. A sufficient accuracy can be expected for a device structure of a serial resistance connection type in which a phase-change material is disposed between metal electrodes. On the other hand, in the vertical type memory as shown in FIG. 1 and FIG. 2, since the thin Si film and the thin phase-change material film are connected in a parallel resistance arrangement, it requires an analysis method dealing with the current diffusion in accordance with the difference in the electric conductivity on every material.

In this case, the following constant current formula modified from the Maxwell equation is used for the calculation of a current density distribution j.

[Equation 1]

$$\nabla j = 0,$$

$$j = -\sigma \cdot \nabla \phi \qquad \text{(equation 1)}$$

in which $\sigma$ is an electric conductivity and $\phi$ is a potential.

A thermal diffusion equation is used for the calculation of a temperature distribution.

[Equation 2]

$$C\frac{\partial T}{\partial t} = \nabla(K \cdot \nabla T) + \frac{j^2}{\sigma}$$ (equation 2)

in which T is a temperature, t is a time, C is a volume heat capacity, K is a thermal conductivity, and Joule heat generation per unit volume is represented as the second term on the right side.

Figure 3:
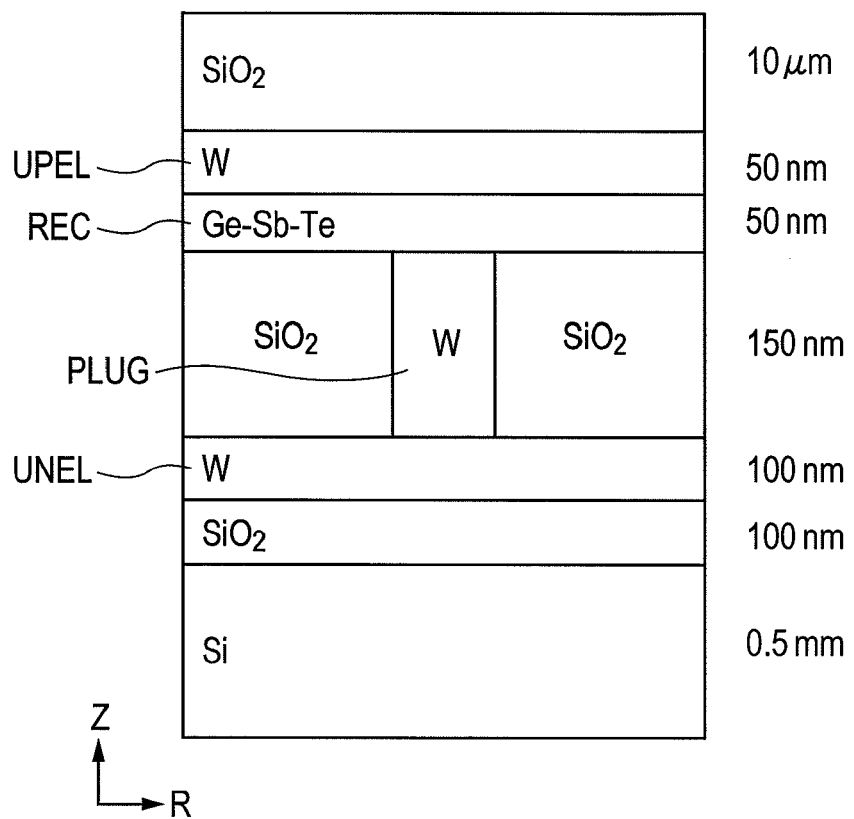
FIG. 3 shows a constitution of a plug device for preliminary experiment.

As a preliminary experiment, a device of a structure shown in FIG. 3 was prepared. In the structure shown in FIG. 3, a 100 nm $SiO_2$ film is disposed over a 0.5 mm silicon substrate Si, a 100 nm tungsten film was disposed thereover as a lower electrode UNEL. Further, a 150 nm $SiO_2$ film is disposed thereover, and a tungsten plug Plug was disposed therein. Then, a 50 nm $Ge_2Sb_2Te_5$ film was formed as a recording film REC and a 50 nm tungsten film was formed as an upper electrode UPEL. In this case, a necessary write current (reset current) was measured while changing the diameter of the W plug in a range from 120 nm to 300 nm.

Figure 4:
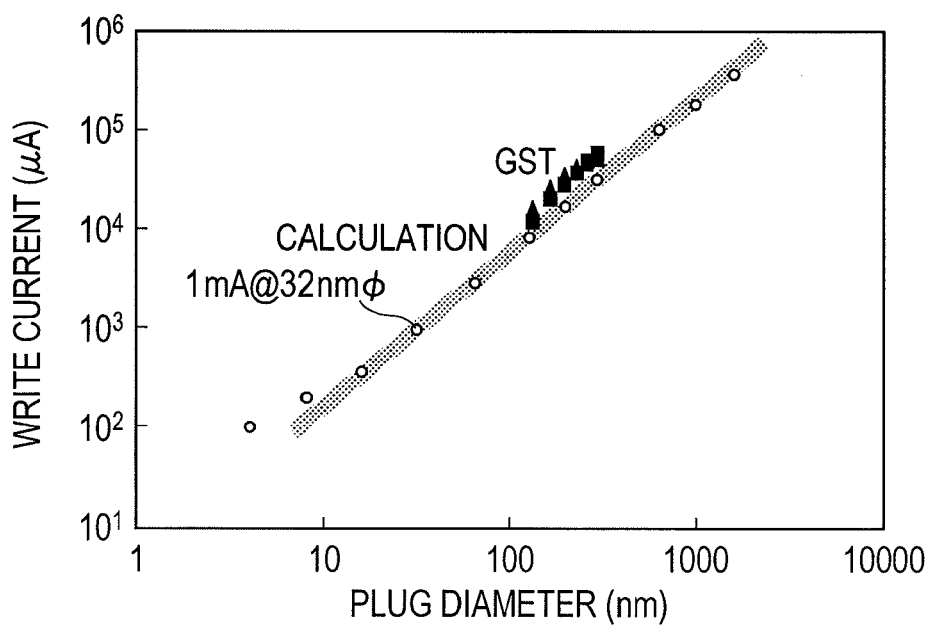
FIG. 4 is a graph showing the result of experiment and analysis for the plug device.

FIG. 4 arranges the result of measurement and the result of analysis in a relation between the plug diameter and the recording current. For the material constant, an actually measured value and a value described in the literatures were used. The electric conductivity of the recording film and the W material were 30 μΩ·m, and 0.24 μΩ·m. The method of measuring the electric conductivity is to be described later. The heat conductivities of the recording film and the W material are 0.5 W/m·K, and 163 W/m·K, respectively. As shown in the graph, it can be seen that the result of the experiment can be explained well by this analysis method. The write current is decreased by decreasing the plug diameter, that is, refining the memory bit portion and it is forecast that a write current of about 1 mA is necessary for the plug diameter of 32 nm. Assuming the critical current density in the thin poly Si film as about $10^7$ A/$cm^2$m, it is necessary that the write current is at least 100 mA or less.

Figure 5:
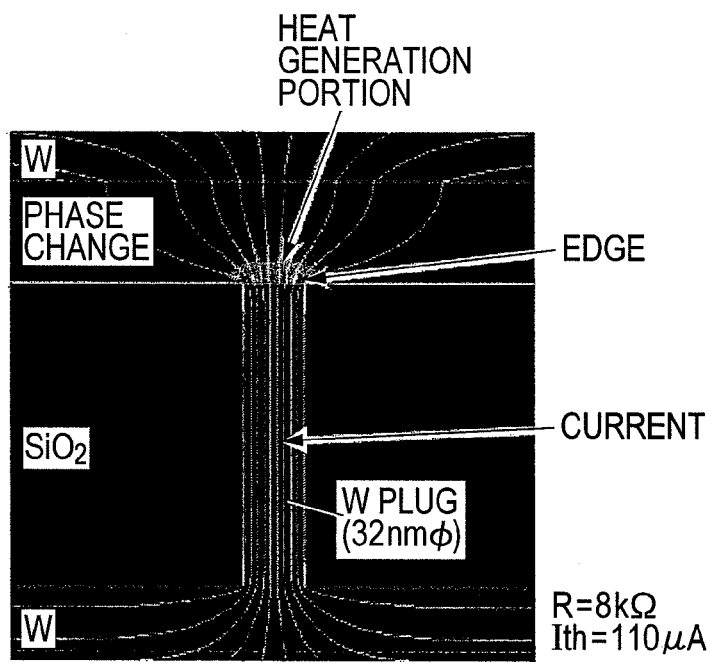
FIG. 5 is a view showing the distribution of current and heat generation in the plug device.

FIG. 5 shows the result of calculation for the distribution of current and the heat generation in a case of a 32 nm plug diameter. In this case, the width of the current pulse was set to 30 ns conforming to the experiment. As shown in the drawing, it can be seen that current and heat generation are concentrated to the edge portion EDGE of the W plug.

Figure 6:
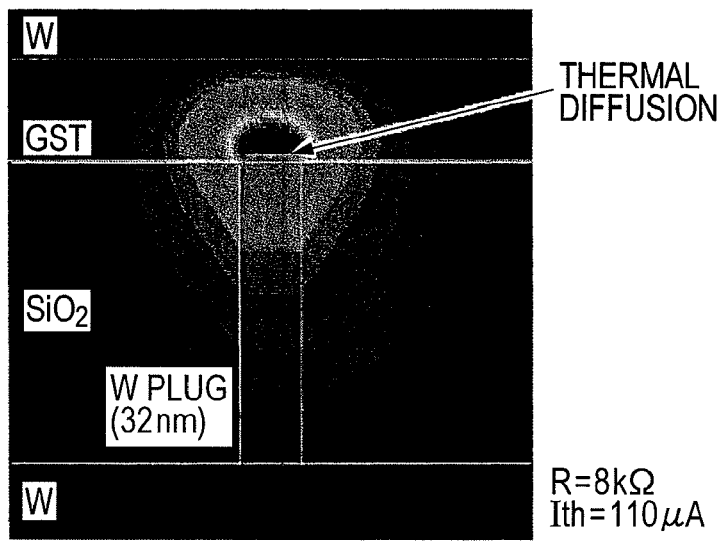
FIG. 6 shows a temperature distribution in the plug device.

In the same manner, FIG. 6 is the result of calculation for the temperature distribution in a case of the 32 nm plug diameter. As shown in the drawing, it can be seen that while Joule heat generation is concentrated, the temperature at the edge portion is low. This shows that the heat energy is dissipated by thermal diffusion since the thermal conductivity of the W plug is 100 times as high as the thermal conductivity of the phase-change material.

Figure 8:
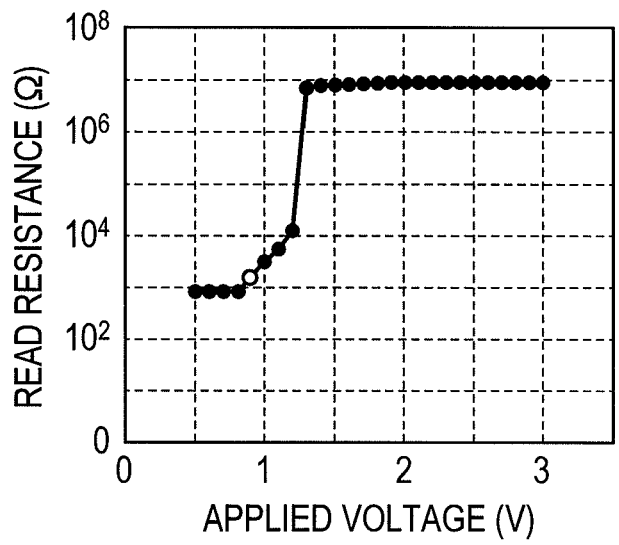
FIG. 8 shows a relation between the shape and the electric resistance of amorphous formed in the plug device.
Figure 16:
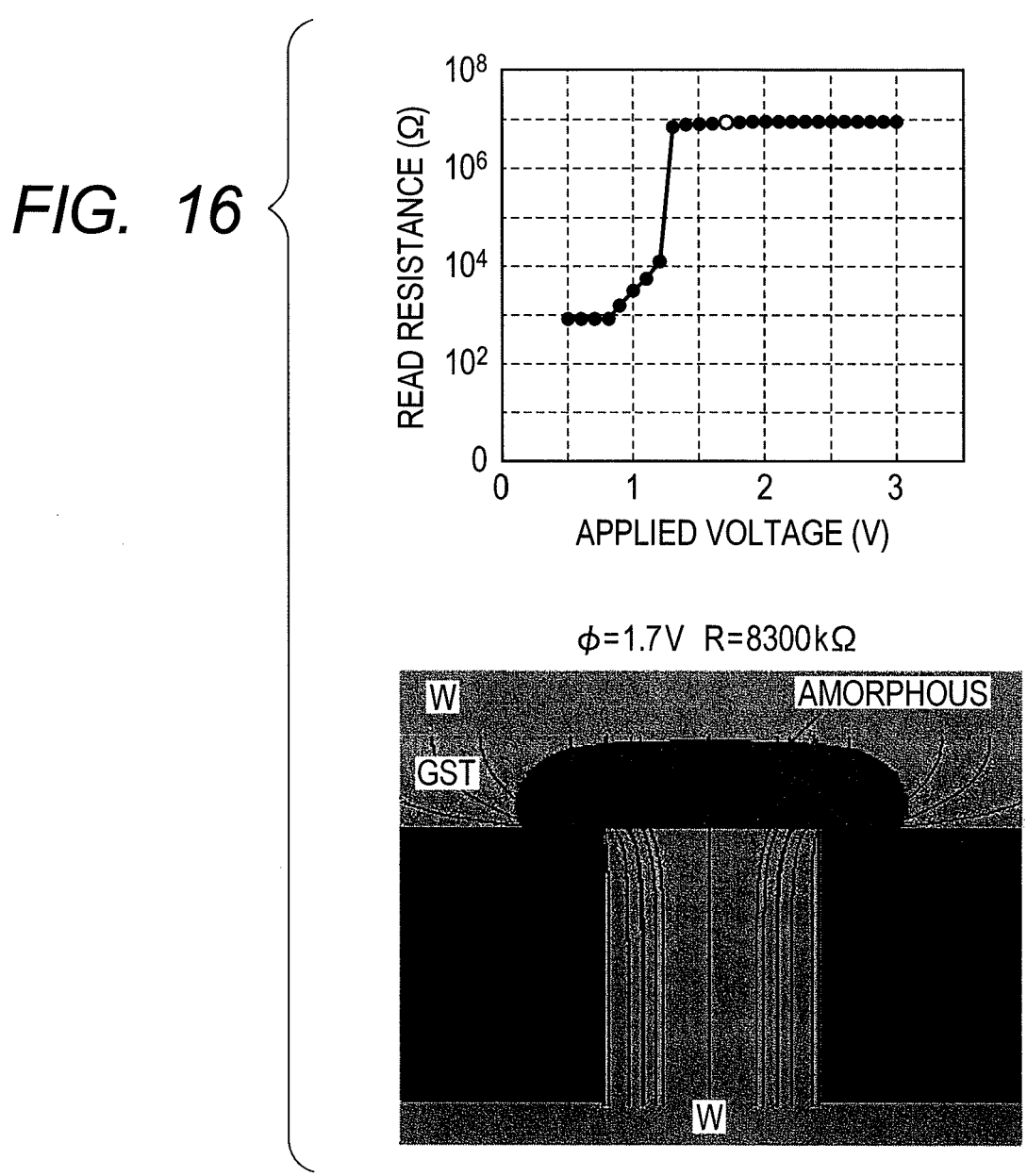
FIG. 16 shows a relation between the shape and the electric resistance of amorphous formed in the plug device.

FIG. 7 to FIG. 16 show the result of calculation showing a relation between the applied voltage upon resetting and the resistance value upon reading in a case of the 32 nm plug diameter. It is assumed that a region at a melting point of 650° C. or higher is in an amorphous state in which the electric conductivity is 1/10000 of that in the crystalline state. The applied voltages from FIG. 7 to FIG. 16 are 0.8, 0.9, 1.0, 1.1, 1.2, 1.3, 1.4, 1.5, 1.6, and 1.7 V respectively. It can be seen that amorphization is generated from the portion above the W plug (portion not in contact with the W plug) while reflecting the temperature distribution described above. As seen in FIG. 8, amorphorization starts from the applied voltage of 0.9 V but the change of the measured resistance value upon read out is small since the electric conductivity in the crystalline state is high. The resistance value during read out is increased in accordance with the applied voltage and it is saturated at the applied voltage of 1.3 V as seen in FIG. 12. In view of the analysis result, it can be seen that about 1.5 times of voltage, that is, about twice Joule heat is necessary for saturating the resistance upon reading compared with the starting voltage upon amorphorization. Referring again, this is because the thermal conductivity of the W plug is high. When an excess heat energy is applied in the write operation, it is considered that the number of rewritable cycles of the phase-change memory device is lowered by the stress due to the thermal expansion and the diffusion of materials. Accordingly, it can be seen that for decreasing the write current and improving the reliability regarding the number of rewrite cycles, it is extremely effective to lower the thermal conductivity of a material adjacent to the phase-change material.

Particularly, in a case of the vertical memory described in JP-A-2008-160004, while the thin Si film and the thin phase-change film are adjacent to each other and the thermal conductivity of the Si material is as high as 176 W/m·K, which is about equal with that of the W material, the phenomenon identical with that in the analysis described above is generated. Further, in the vertical memory structure, the electric property of the thin Si film is deteriorated since the material is diffused in the thin Si film or the temperature of the thin Si film increases when the thin phase-change film is melted.

In view of the result described above, in the phase-change memory device of the vertical memory structure, it can be seen that formation of a thin film of an interface layer material having a lower thermal conductivity than the thin Si film between the thin Si film and the thin phase-change material film is effective with a view point of decreasing the write current and improving the reliability of the phase-change memory device. It has been described for the structure that the interface layer 100 is in contact on its lateral side with the phase-change material layer 7 and in contact on its other lateral side with the polysilicon channel layer 8p in FIG. 1 and FIG. 2. This is because the connection hole can be made smaller by decreasing the amount of the material formed on the lateral side of the gate polysilicon layers 21p, 22p, 23p and 24p, and the insulating film layers 11, 12, 13, 14, and 15 formed alternately and this is suitable to the refinement. However, it may be considered, for example, that an adhesive layer or like other member for improving adhesiveness between the polysilicon channel 8p and the interface layer 100 may be added. Also in such a case, it is preferred that the thermal conductivity of the interface layer 100 is lower than that of the semiconductor material forming the channel layer. This is because the thermal diffusion is generated more in a member of a larger volume, and the volume of the channel layer is increased in order to lower the resistance value. It is preferred that the lateral side on which the phase-change material is provided is in contact with the phase-change material layer since the heat insulation effect is increased.

Further, it is necessary for the material forming the interface layer that the material thermally insulates the thin Si film and the thin phase-change material film, as well as maintains electric connection for flowing a current by way of the interface layer 100 to the phase-change material layer 7. An example of the material is an Si—Te material. Specific examples of the material suitable to the interface layer are to be described later.

Then, characteristic analysis was conducted for the phase-change memory device of vertical structure shown in FIG. 2.

FIG. 2 shows a phase-change memory material 7, an interface layer 100, a channel polysilicon layer 8p for flowing a write current, and a protective film 101 disposed for thermal and electrical insulation between the phase-change memory materials. In the characteristic analysis, the distance between two gate insulating films 9 opposed to each other was set to 32 nm, the gate width was set to 50 nm, and the gate period was set to 100 nm. The film thicknesses of the gate insulating film layer, the polysilicon channel layer, the interface layer, the phase-change material layer 7, and the $SiO_2$ protective film were set to 3 nm, 3 nm, 3 nm, 3 nm, and 8 nm, respectively. The pulse width for flowing the write current was set to 10 ns.

For making the difference clear with respect to the heater material described in JP-A-2009-117854, a relation between the electric conductivity and the thermal conductivity is arranged in FIG. 17. In JP-A-2009-117854, necessary voltage during recording is decreased by stacking thin phase-change material films and thin heater material films between the electrodes. As specific heater materials, good conductors such as C, W, Mo, TiN, etc. are set forth. In the table, the physical characteristic values for C, W, and Mo are those disclosed in chronological Scientific Table, etc. For TiN, since the electric conductivity changes depending on the manufacturing method, values of the thin TiN film material used in the inventors' experiment are shown.

Figure 18:
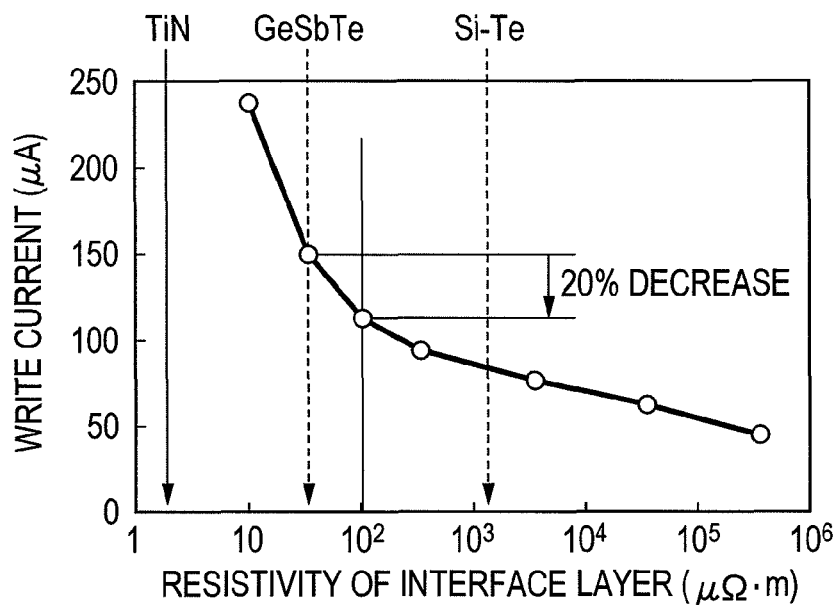
FIG. 18 shows the result of simulation showing the relation between the electric resistivity and the write current of an interface layer.

FIG. 18 shows the result of calculation for determining a relation between the electric resistivity and the write current of the interface layer in the structure of FIG. 2. Since chalcogenide materials are mainly preferred as the interface layer as will to be described later, the thermal conductivity of the interface layer was set to 0.5 W/m·K, which is identical with that of the phase-change material while assuming the use of the chalcogenide material. As can be seen from the graph, when the electric resistivity of the interface layer exceeds 100 $\mu\Omega\cdot m$ (about three times as high as the phase-change recording material), the write current can be decreased by 20% or more and a remarkable effect of the invention is developed. For example, the current decreasing effect is further larger in the Si—Te material. On the other hand, in a case of using TiN it has been found that while the write voltage is lowered the write current is increased as to be described later. Accordingly, it is considered that TiN is not suitable to the vertical structure using Si for the current channel as described above.

Figure 19:
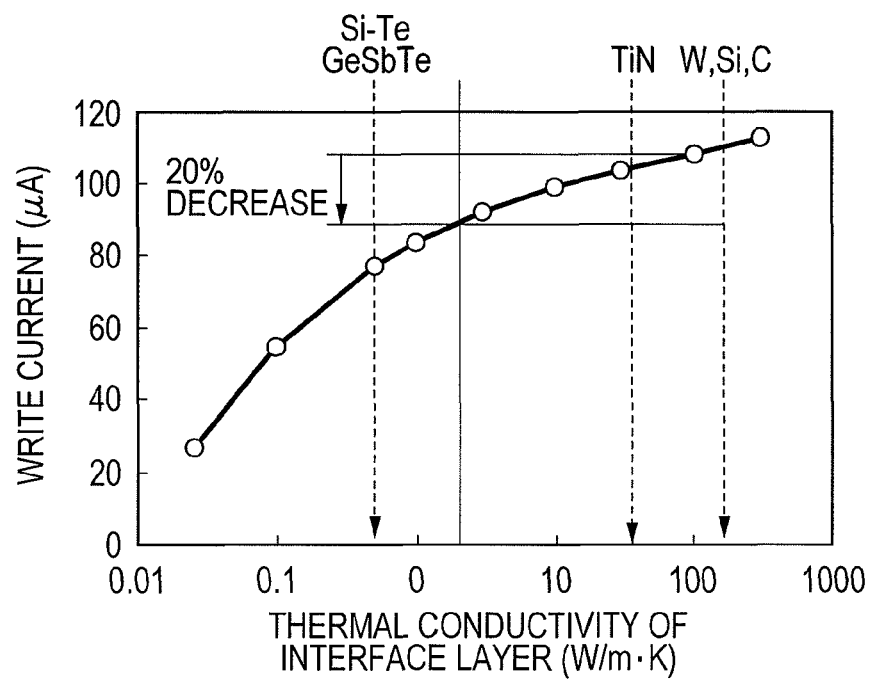
FIG. 19 shows the result of simulation showing the relation between the thermal conductivity and the write current of an interface layer.

FIG. 19 shows the result of calculation that determines a relation between the thermal conductivity and the write current of the interface layer in the structure of FIG. 1. The electric resistivity of the interface layer was set to 3000 $\mu\Omega\cdot m$ in view of the result described above. As seen in the graph, when the thermal conductivity of the interface layer is below 20 W/m·K (about 1/10 of Si channel material), the write current can be saved by 20% or more and a remarkable effect of the invention is developed. For example, the current decreasing effect is further larger when the Si—Te material is used.

For making the effect of the invention clearer, the result of calculation for the distribution of current and temperature is shown. For easy understanding, it is shown for the result of using the device structure shown in FIG. 1, that is, a device structure in which the phase-change material layer 7 is formed inside the Si cylinder. In this case, since the analysis is conducted on the R-Z coordinate system and the distribution for the temperature and current shows a symmetrical form with respect to the direction R, the situation can be recognized simply.

Figure 20:
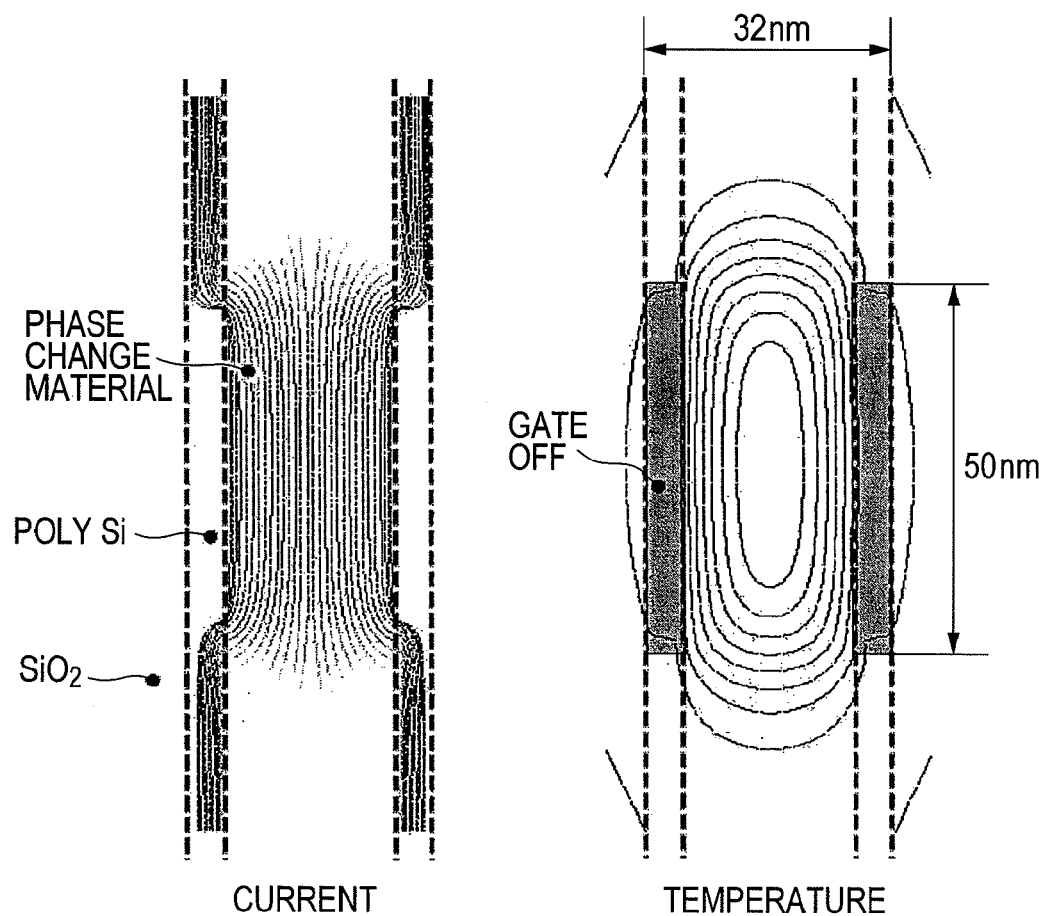
FIG. 20 shows the result of simulation showing the current and the temperature distribution of a vertical type memory constitution.

FIG. 20 shows the result when a GeSbTe phase-change material is buried inside the Si channel as a representative for the structure described in JP-A-2008-160004. The film thickness of the Si channel is 4 nm. This shows the situation where the current generates heat while diffusing from the Si channel and diffusing in the phase-change material. The write current is 103 µA.

Figure 21:
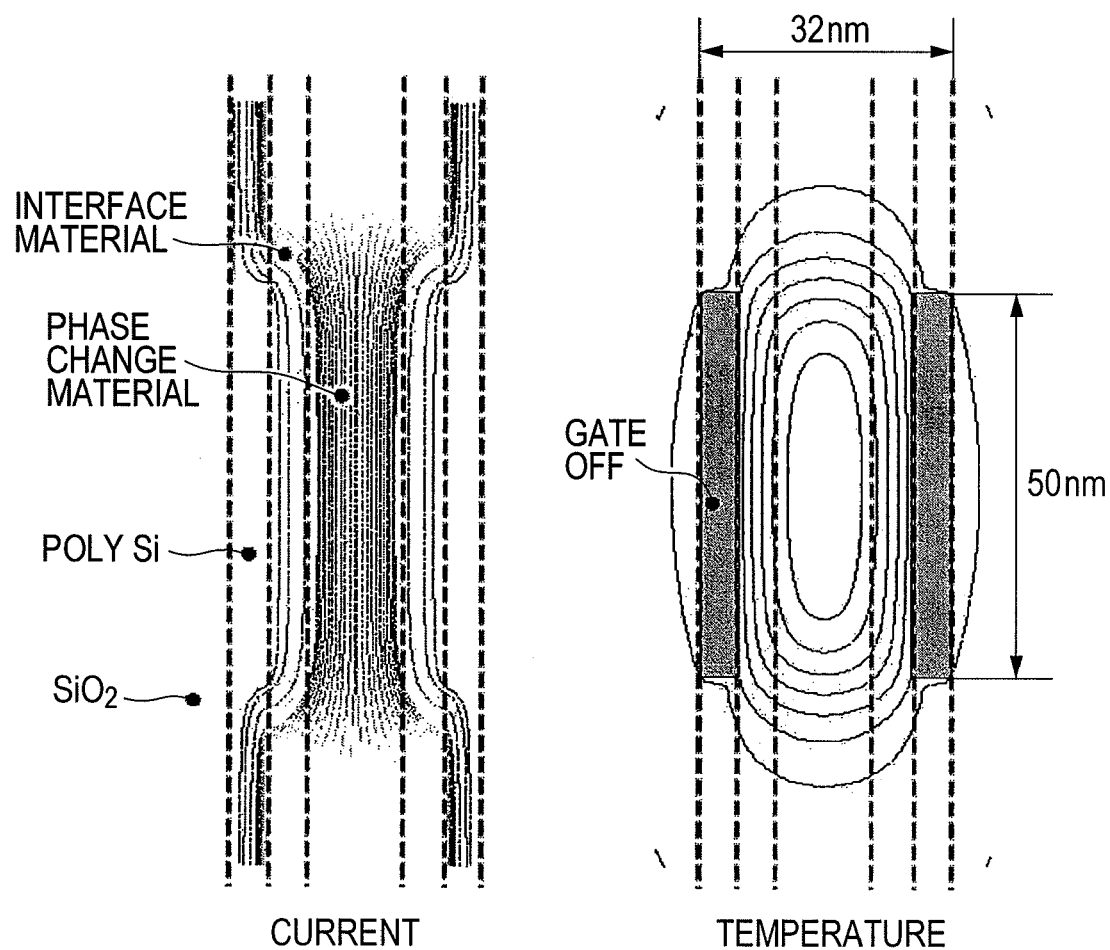
FIG. 21 shows the result of simulation showing the current and the temperature distribution of a vertical type memory constitution.

FIG. 21 shows the structure in FIG. 1 of the invention in which the film thickness of the interface layer material was 4 nm, the electric resistivity was 100 times as high as the electric resistivity of the phase-change material, and the thermal conductivity was made identical with the phase-change material. As seen in the drawing, since the electric resistivity of the interface layer is high, the current flows concentrically to the phase-change material. At the same time, it can be seen the state in which heat generation is concentrated to the phase-change material along with the effect that the thermal conductivity of the interface layer material is low. In this example, the write current is decreased to about 1/10.

Figure 22:
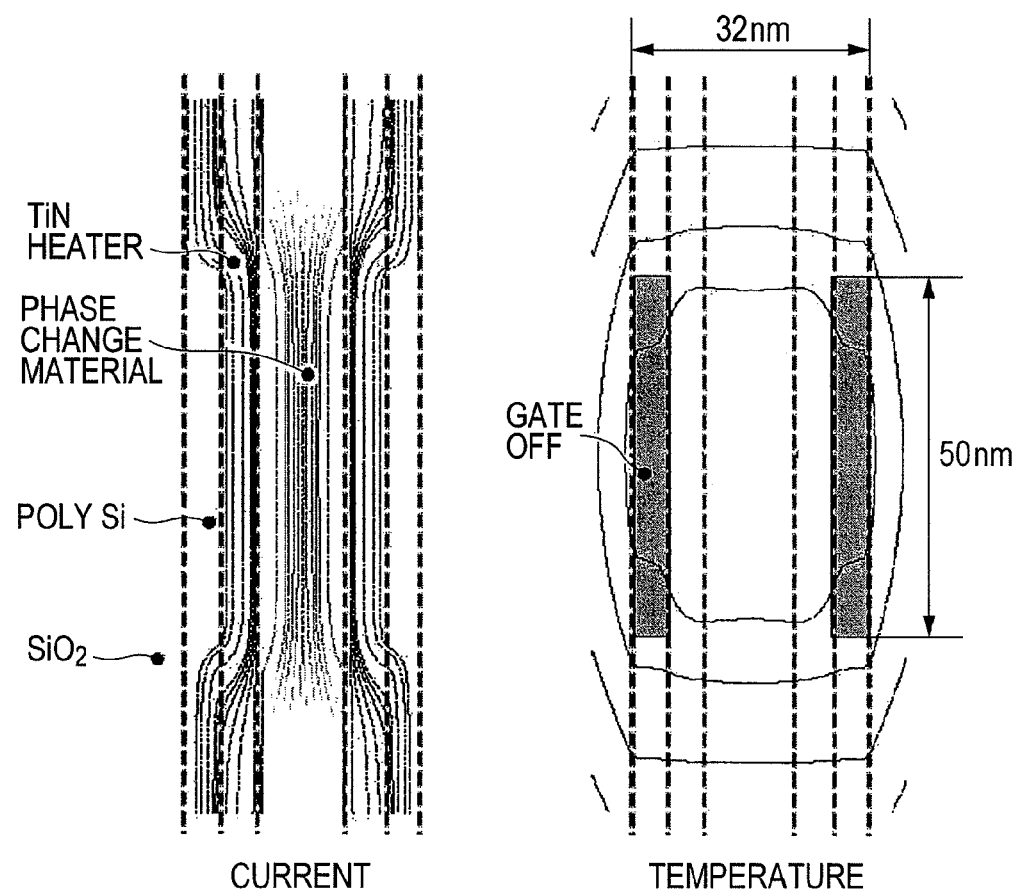
FIG. 22 shows the result of simulation showing the current and the temperature distribution of a vertical type memory constitution.

FIG. 22 shows a case where TiN having the lowest thermal conductivity among the heater materials described in JP-A-2009-117-854 is formed between the Si channel and the phase-change material (structure in which the portion of the interface layer 100 in FIG. 1 is formed of TiN). The current flows concentrically to the TiN film and the temperature of the phase-change material increases due to the thermal diffusion by heat generation of TiN. While the effect of decreasing the write voltage is confirmed, the write current increases as large as 1400 µA.

Figure 23:
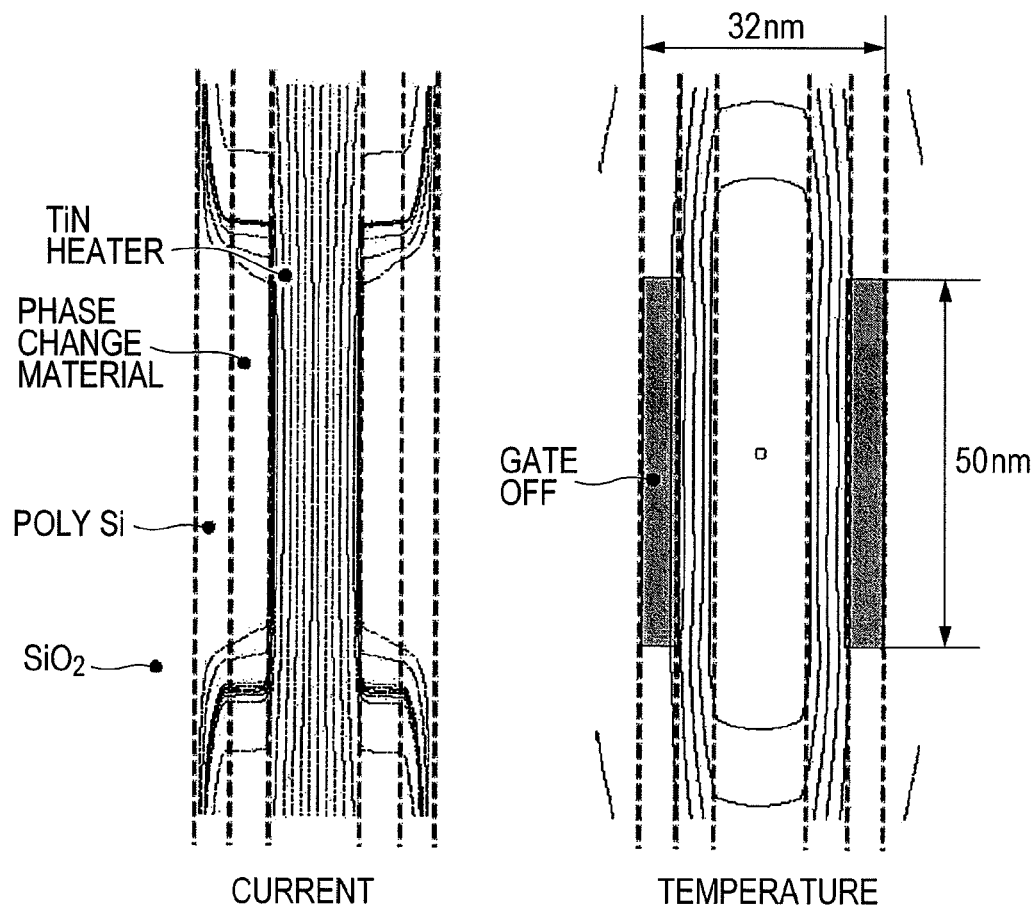
FIG. 23 shows the result of simulation showing the current and the temperature distribution of a vertical type memory constitution.

FIG. 23 shows a case where TiN having the lowest thermal conductivity among the heater materials described in JP-A-2009-117854 is formed further inside of the phase-change material. The phenomenon where the current flows concentrically to the TiN film and the temperature of the phase-change material is increased by the thermal diffusion due to the heat generation of TiN is identical with that in FIG. 22. The write current is 640 µA.

Figure 24:
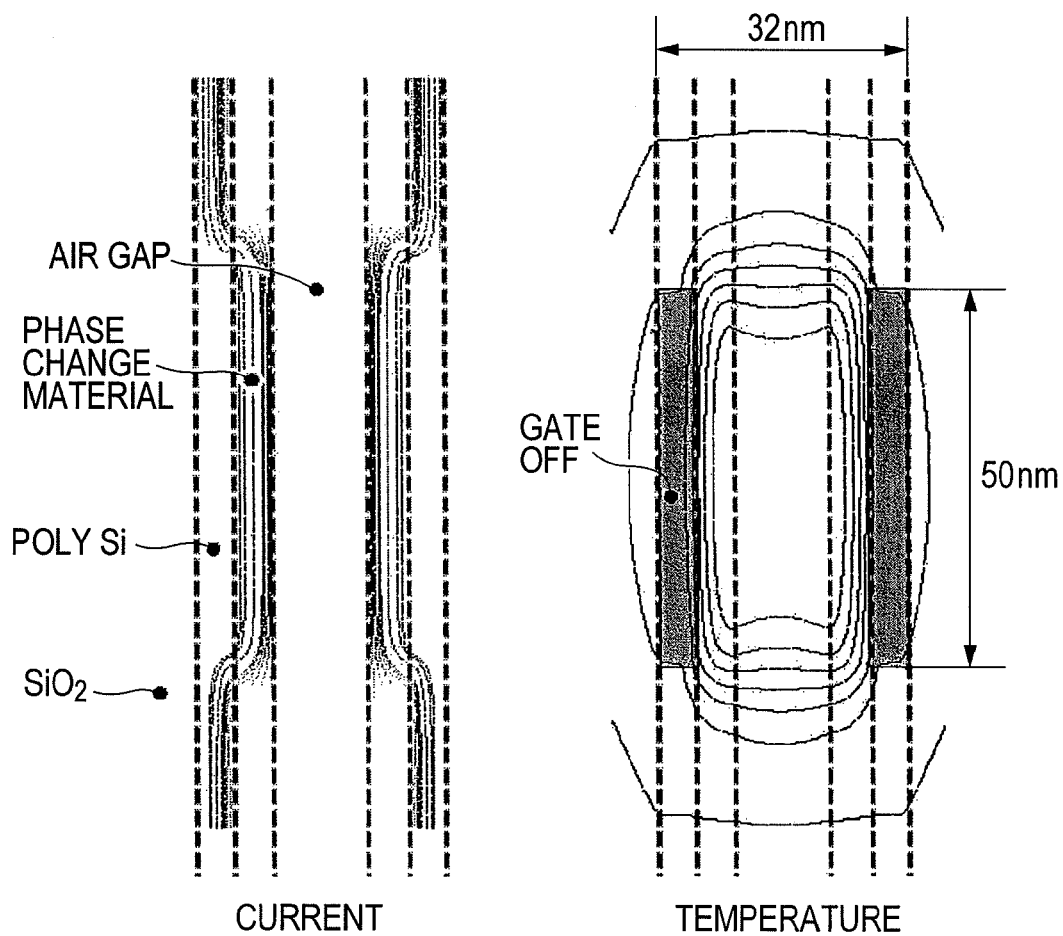
FIG. 24 shows the result of simulation showing the current and the temperature distribution of a vertical type memory constitution.

FIG. 24 shows an example of forming a phase-change material into a hollow shape and forming an air heat insulating layer at the inside for heat insulating the phase-change material and improving the thermal efficiency. While current is concentrated to the phase-change material of a reduced thickness, since the thermal conductivity of the adjacent Si channel is so high and identical with that of the metal material, the write current is 92 µA and no remarkable current decreasing effect can be found.

As apparent from the result of the simulation described above, it can be seen that the structure of the invention in which an interface layer of high resistance and low thermal conductivity is formed between the Si channel and the phase-change material has a remarkable current decreasing effect and has an excellent performance as a phase-change memory device of vertical memory structure.

As described above, it is preferred that the interface layer 100 is in contact with the phase-change material layer 7 on one side thereof with a view point of the heat insulating effect. In this case, it directly undergoes the effect of the heat generation of the phase-change material layer 7. Accordingly, since it is necessary to be in a stable solid state during writing, the interface layer preferably has a melting point higher than that of the phase-change material.

Figure 25:
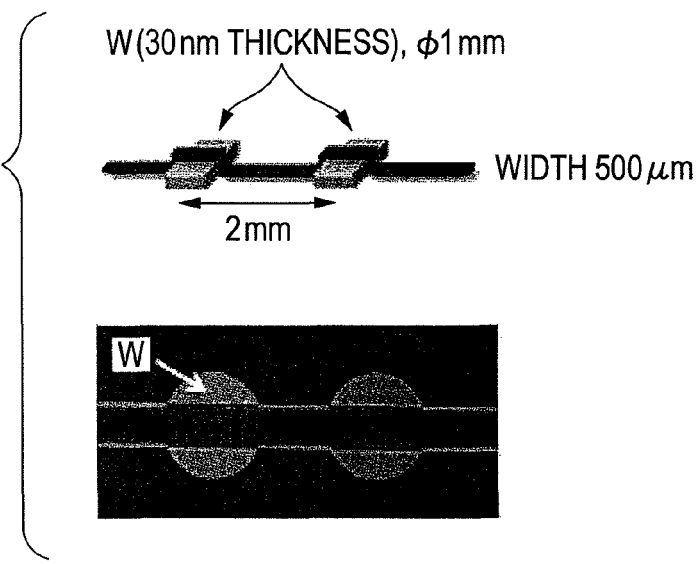
FIG. 25 shows a device structure for measuring a temperature hysteresis of a resistance measuring device.

As has been described above, the interface layer preferably comprises a material having a thermal conductivity lower than that of the channel portion (polysilicon channel 8p in this embodiment) and a resistivity higher than that of the phase-change material layer. Then, it is shown what is such a material. FIG. 25 shows the structure and the photograph for the appearance of the resistance measurement device for searching materials suitable to the interface layer. As described above, the resistivity of the phase-change material changes depending on the temperature and the electric field. In this embodiment, it was considered such that the electric resistance of the thin film material is measured in a state at a sufficiently small electric field by setting the distance between electrodes to 2 mm for avoiding the effect by the electric field. The device has a structure comprising a 30 nm thickness W as an electrode material formed over a glass substrate, a thin film material to be measured at 50 nm film thickness, and a 50 nm protection $SiO_2$ film formed thereover. This is to be referred to as a resistance measurement device.

Figure 26:
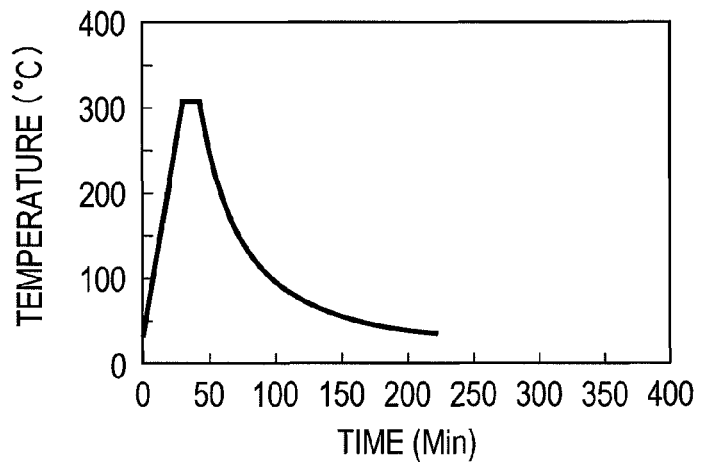
FIG. 26 is a graph showing the temperature hysteresis of the resistance measuring device.
Figure 27:
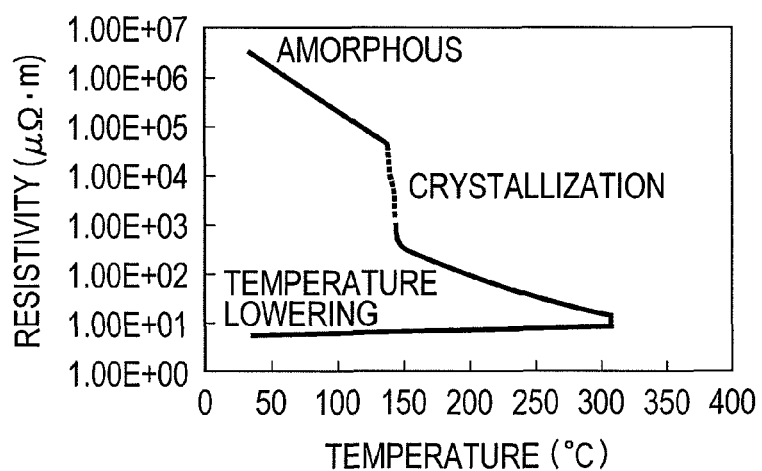
FIG. 27 is a graph showing a relation between the temperature and the resistivity of a GeSbTe film.

FIG. 26 and FIG. 27 show examples of measuring the temperature and the resistivity of the resistance measuring device. A $Ge_2Sb_2Te_5$ film is used as the measured material. FIG. 26 shows the temperature hysteresis of the device. A resistance measurement device is formed such that it is in an amorphous state as deposited and the change of the resistivity due to crystallization was examined while changing the temperature. FIG. 27 shows the change of the electric resistivity of the $Ge_2Sb_2Te_5$ film depending on the temperature. It can be seen that the crystallization temperature is about 150° C. in view of FIG. 27. By the measurement described above, the electric resistivity of the thin film material in the amorphous state and the crystalline state can be measured.

Figure 28:
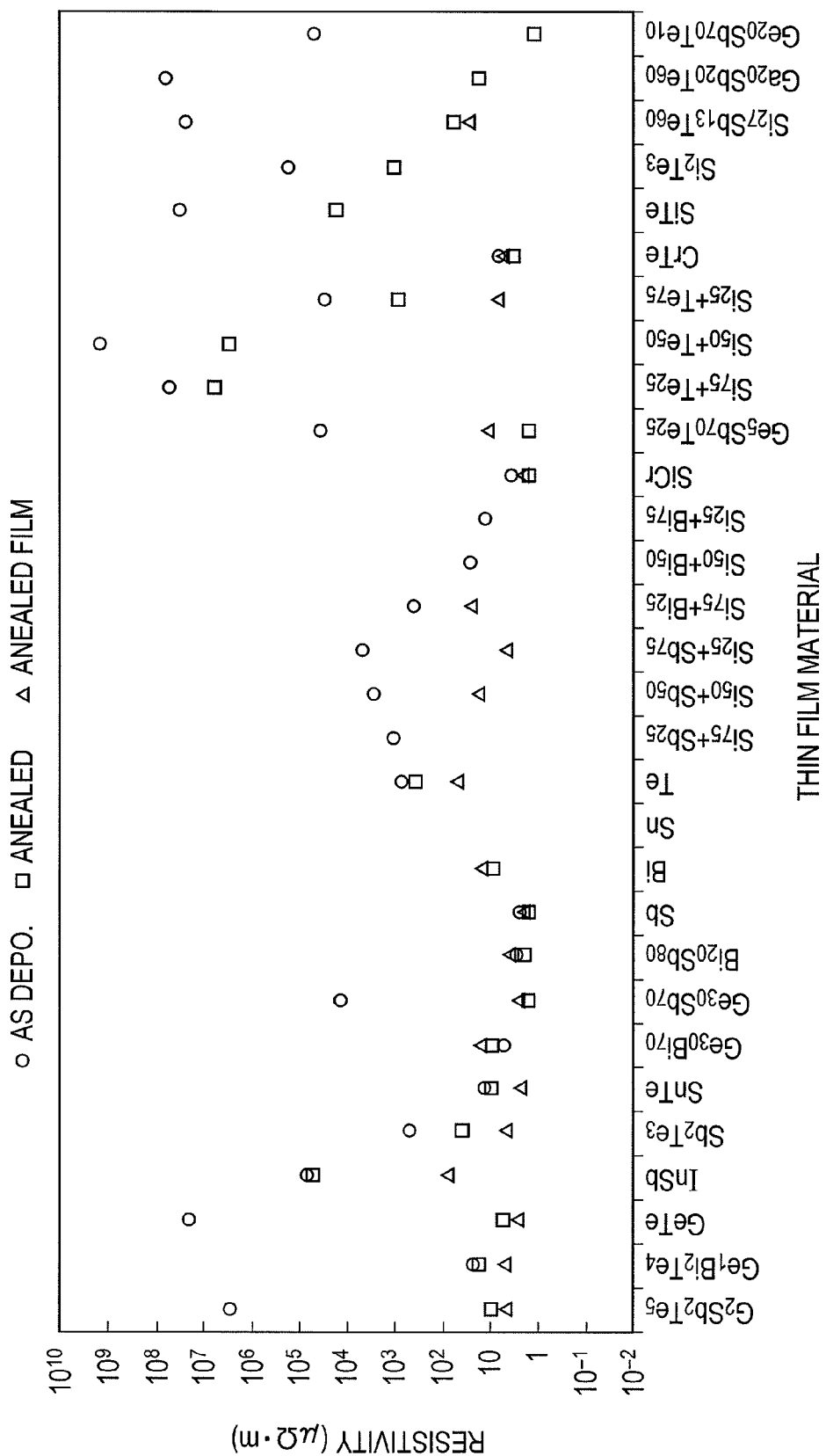
FIG. 28 shows electric resistivity of various thin film materials.

FIG. 28 shows the result of measurement for the electric resistivity of various thin film materials. From the result of the simulation, it can be seen that the material suitable to the interface layer of the thin film material suitable to the interface layer can provide a particularly remarkable effect when the electric resistivity thereof is three times as high as the phase-change material. With the view point described above, it has been found that the materials suitable to the interface layer material is mainly chalcogenide type materials such as In—Sb, Si—Cr, and Si—Te. Other materials suitable to the material for the interface layer can also be sought by way of the identical evaluation. Particularly, the chalcogenide type material are suitable to the material for the interface layer since they have low thermal conductivity and appropriate electric resistance. The gist of the invention does not lie in individual materials but resides in that the electric resistivity of the thin interface layer film is higher than that of the phase-change material layer, and the thermal conductivity of the interface layer film is lower than that of the material that forms the channel portion. Referring further, when the electric resistivity is at least three times as high as the phase-change material layer, a current is concentrated to the phase-change material layer, and a material having a thermal conductivity of $\frac{1}{10}$ or lower of the material that forms the channel portion generally functions as an excellent interface layer material.

Figure 29:
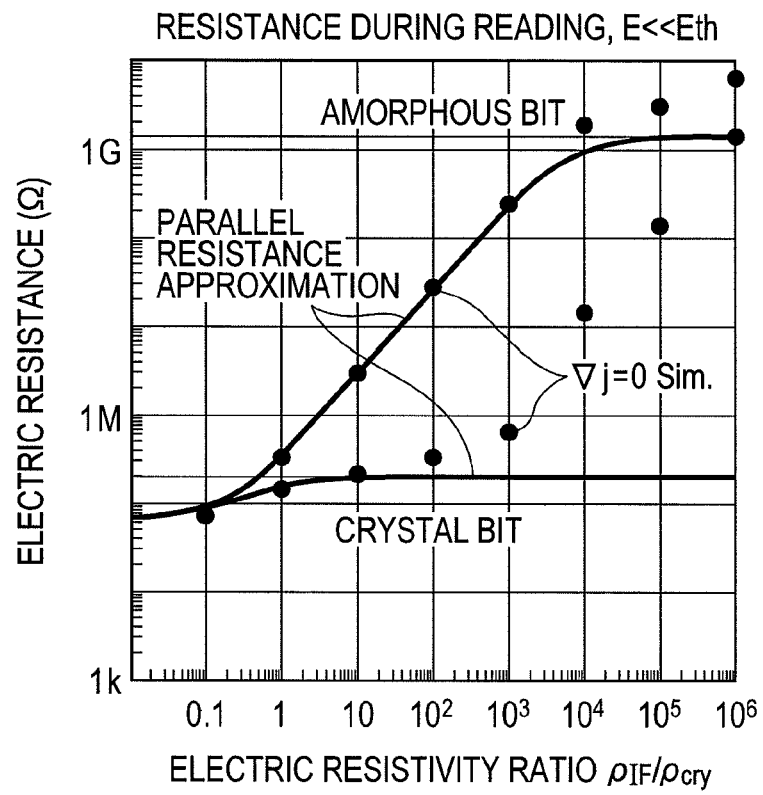
FIG. 29 is a graph showing the change of the resistivity and the device resistance of the interface layer material.

FIG. 29 shows the result of simulation showing a relation between the electric resistivity of the interface layer material and the electric resistance of the memory device. As shown in the graph, since the ratio of change for the resistance value of the device becomes smaller between the amorphous state and the crystalline state of the phase-change material when the electric resistivity of the interface layer material is excessively high, the upper limit for the electric resistivity of the interface layer material is preferably about 10,000 times of the phase-change material.

Example 2

Figure 30:
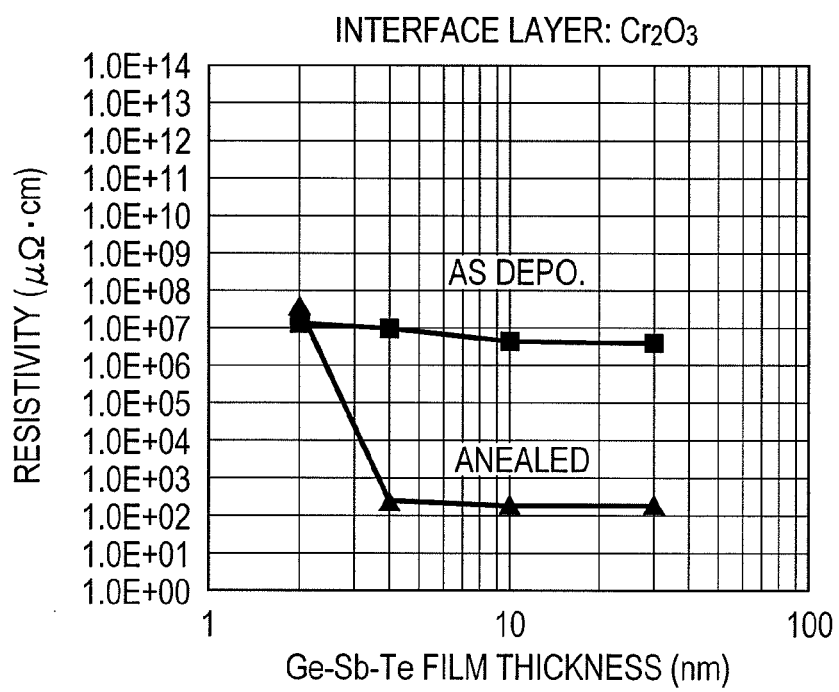
FIG. 30 shows the electric resistivity and the film thickness of the interface layer.
Figure 31:
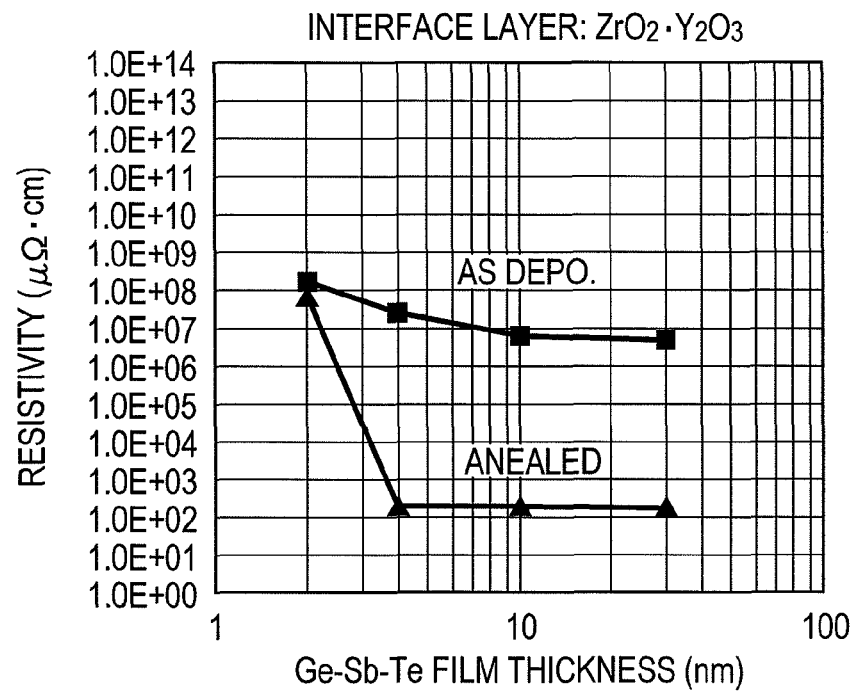
FIG. 31 shows the electric resistivity and the film thickness of the interface layer.
Figure 32:
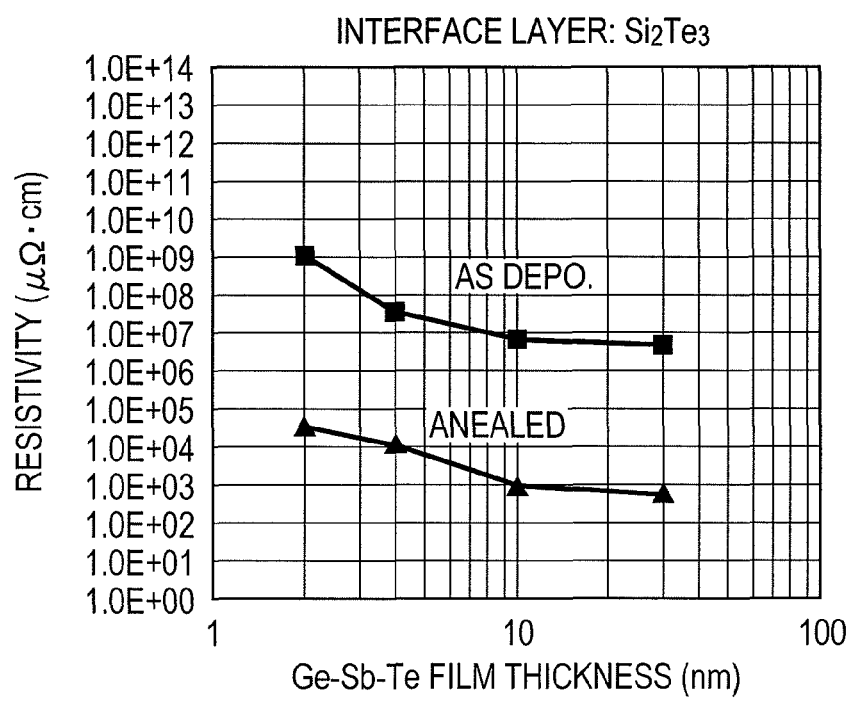
FIG. 32 shows the electric resistivity and the film thickness of the interface layer.

As described above, at the minimum feature size of 32 nm by lithography, the film thickness of the phase-change material was about 4 nm. For proceeding the refinement further, it is necessary for the phase-change material to conduct reversible switching between amorphous and crystalline states at the film thickness of less than 4 nm. It has been generally considered that crystallization becomes difficult and switching operation is no more shown when the thickness of the phase-change material is about 6 nm or less. Then, by utilizing the resistance measurement device described above, the film thickness and the switching characteristics of the phase-change material sandwitched by various interface material films were measured. In this example, a $Ge_2Sb_2Te_5$ compound material was used as the phase-change material. FIG. 30 to FIG. 32 show the result of measuring the resistivity change from an as deposited amorphous state to a crystalline state in the same manner as described above. The thickness of the interface layer material was 20 nm. FIG. 30 shows the result of an experiment in a case of using $Cr_2O_3$ as the interface layer material. At the film thickness of the phase-change material of less than 4 nm, change from the amorphous state to the crystalline state did not occur. FIG. 31 shows the result of an experiment in a case of using $ZrO_2$ with addition of $Y_2O_3$ as the interface layer material. In the same manner, phase-change did not occur at the film thickness of less than 4 nm. On the other hand, FIG. 32 shows the result of an experiment in a case of using $Si_2Te_3$ as the interface layer material. Necessary performances of the interface layer material for electrically switching the phase-change material between the crystalline state and the amorphous state are considered as described below.

(1) It has a necessary and sufficient adhesiveness so as to withstand a stress caused by volume change accompanying the phase change between the crystalline state and the amorphous state.

(2) It does not hinder the crystallization of the phase-change material.

(3) It has good adhesiveness with a semiconductor material (Si) as a current channel.

It is considered that an $Si_2Te_3$ material satisfies such performances. An SiTe material also satisfies the same required performances though the melting point is lower. In view of the result of the experiments described above, it can be seen that a first system including an alloy system of Si and chalcogenide is suitable as the interface layer material. For the material system, a first material system such as Si—Te system, Si—Sb system, Si—Bi system, Si—Sn system, and Si—Ge system is suitable. Unless otherwise specified particularly, those represented as "X-Y" show that they contain alloys of X and Y and may contain elements other than X and Y.

Further, as a second material system in which an oxide thereof is a material having good adhesiveness with Si and the phase-change material and oxygen is substituted by Te belonging to an identical periodical group, materials of Cr—Te system, Zn—Te system, Mn—Te system, Zr—Te system, and Hf—Te system are also suitable.

Figure 33:
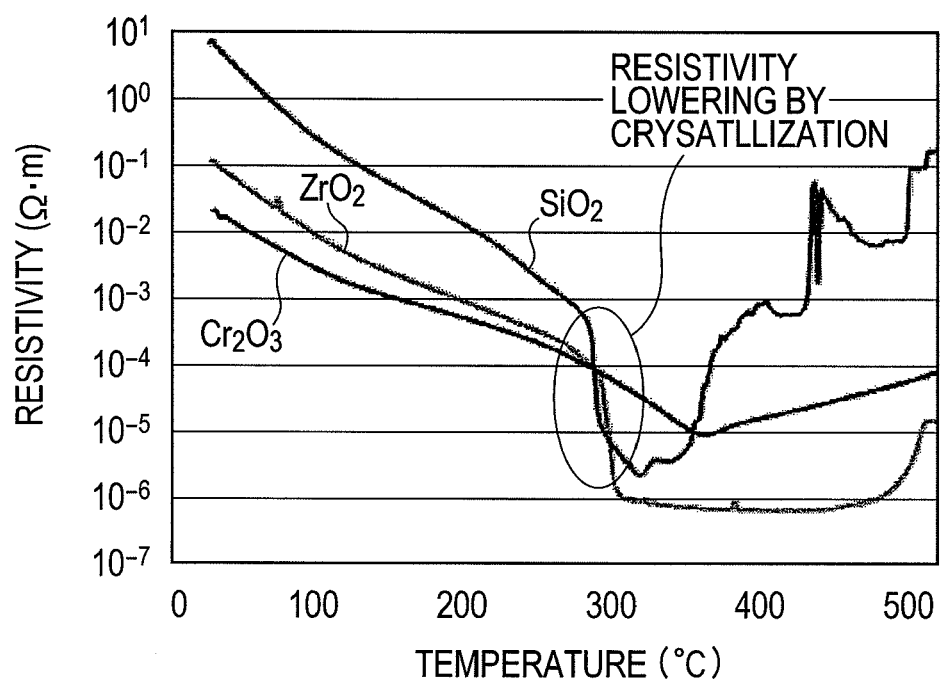
FIG. 33 is a graph showing the temperature dependent change of the resistivity of eutectic phase-change materials.

The experiment described above shows the results for the case of using the $Ge_2Sb_2Te_5$ compound material as the phase-change material. In a case of using a metal oxide as the interface layer, no good result could be obtained when the thickness of the phase-change material was 2 nm. In a case of the metal oxide such as $ZrO_2$ (with addition of $Y_2O_3$) it can be considered that a metal material and a phase-change material form a compound at a bonded face, which improves the adhesiveness but, at the same time, inhibits crystal growing of the phase-change material. Then, an experiment was conducted by using a Ge 5%-Sb 70%-Te 25% material as a typical eutectic phase-change material having a high crystal growing rate as the phase-change material. FIG. 33 shows the result of an experiment showing a relation between the temperature and the resistivity of samples. The thickness of the eutectic phase-change material is 2 nm. In this experiment, $SiO_2$, $Cr_2O_3$, and $ZrO_2$ (with addition of $Y_2O_3$) were used as the material of the oxide interface layer. As can be seen in the graph, abrupt lowering of the resistivity due to crystallization was observed even at a film thickness of the phase-change material of 2 nm in a case of $SiO_2$ and $ZrO_2$ (with addition of $Y_2O_3$). However, in a case of using the $SiO_2$ material for the interface layer, the adhesiveness was insufficient and the resistivity increased due to defoliation of phase-change material. In view of the result described above, it can be seen that the adhesiveness with the phase-change material increases in the order of: $SiO_2 < ZrO_2$ (with addition of $Y_2O_3$) $< Cr_2O_3$. It has been found that since $SiO_2$ lacks in the adhesiveness and $Cr_2O_3$ shows excessive adhesiveness, they greatly hinder the crystal growing of the phase-change material due to the joined face, a metal oxide having an appropriate adhesiveness such as $ZrO_2$ (with addition of $Y_2O_3$) is suitable to the reduction of the thickness of the recording film, that is, improvement in the recording density. Since the interfacial energy between the $Zr_2O_3$ (with addition of $Y_2O_3$) and the eutectic phase-change material was 1.7 $mJ/m^2$ by measurement to be described later, it can be seen that a metal oxide having an the interfacial energy of about 3 mJ or less is suitable to the interface layer for the phase-change material at a thickness of 4 nm or less. A third material system having a similar performance includes $HfO_2$, etc. As the result described above, it is apparent that $Cr_2O_3$ can be used as the third material system in a case where the thickness of the phase-change material is 4 nm or more.

Figures 34A, 34B:
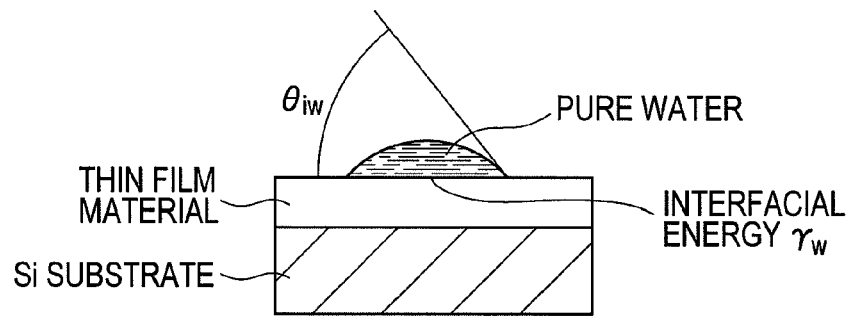
FIG. 34B shows characteristics of materials.

A simple method of measuring the surface energy and the interfacial energy is to be described additionally. In this case, SiTe, SiSb, $ZrO_2$, and AlTiN were investigated as the material for the interface layer. An angle of contact with pure water was measured for the material for the interface layer and $Ge_2Sb_2Te_5$ as a typical phase-change material. For the test, specimens of the following two type structures were prepared: Si substrate/interface layer (50 nm), and Si substrate/interface layer (50 nm)/phase-change film (50 nm). Films were formed by sputtering. $Si_2Te_3$ and $ZrO_2$ were formed by using sputtering targets having corresponding compositions. SiSb and AlTiN were formed by simultaneously sputtering of Si and Sb, and AlN and TiN respectively. For removing the spontaneous oxide film on the surface of the Si substrate, reverse sputtering for about 10 sec was conducted to the substrate before sputtering. Since it is forecast for actual devices that the film thickness is several nm and the adhesiveness has thickness dependence, confirmation in the state of the thin film is necessary. However, for confirming the property of the material per se, as a first stage, a sufficiently thick film was used. Further, while $ZrO_2$ used herein contains $Y_2O_3$ by about 3% for suppressing volume expansion of $ZrO_2$ as that used for usual devices, it is described as $ZrO_2$ for the sake of simplicity. FIG. 34A schematically shows the measuring method for the angle of contact between a material and pure water. Pure water was dropped onto a thin film formed over an Si substrate and an angle $\theta_{iw}$ in the drawing was measured.

A method of approximately estimating the interfacial energy $\gamma_{i-PC}$ per unit area at the boundary between the interface layer and the phase-change material is to be described.

Assuming the surface tension of the interface layer as $\gamma_i$, the surface tension of pure water in air as $\gamma_w$, and the interfacial energy between the interface layer and the pure water as $\gamma_{iw}$, it is represented according to the Young's equation as:

[Equation 3]

$$\gamma_{iw} + \gamma_w \cos\theta_{iw} = \gamma_i \quad \text{(equation 3)}$$

The factors for energy generation are mainly classified into three types, that is, dispersive force (main cause for van der Waals force), dipole-dipole interaction, and hydrogen bond. When the energies are expressed as $\gamma_d$, $\gamma_p$, and $\gamma_n$, respectively, they are shown according to the expanded Fowkes equation as:

[Equation 4]

$$\gamma_{iw} = \gamma_i + \gamma_w - 2\sqrt{\gamma_i^d \gamma_w^d} - 2\sqrt{\gamma_i^p \gamma_w^p} - 2\sqrt{\gamma_i^h \gamma_w^h} \quad \text{(equation 4)}$$

[Equation 5]

$$\gamma = \gamma^d + \gamma^p + \gamma^h \quad \text{(equation 5)}$$

Values for respective term relative to water have been known and $\gamma_w^d = 72.8$ $mJ/m^2$, $\gamma_w^d = 29.1$ $mJ/m^2$, and $\gamma_w^p = 1.3$ $mJ/m^2$, $\gamma_w^h = 42.4$ $mJ/m^2$. For $SiO_2$ and $ZrO_2$, it is known that $\gamma_{SiO2} = 760$ $mJ/m^2$, and $\gamma_{ZrO2} = 800$ $mJ/m^2$. According to actual measurement for the angle of contact, it was $\theta_{iw} = 5°$ for $SiO_2$ and $\theta_{iw} = 52°$ for $ZrO_2$. Assuming that hydrogen bond does not exert between the materials and pure water and $\gamma_i^h = 0$, then $\gamma_{SiO2}^d = 320.4$ $mJ/m^2$, $\gamma_{SiO2}^p = 439.6$ $mJ/m^2$, $\gamma_{ZrO2}^d = 251.3$ $mJ/m^2$, and $\gamma_{ZrO2}^2 = 548.7$ $mJ/m^2$, and the dipole-dipole interaction is larger than the dispersion force in the calculation. This can be understood based on a large difference of the electronegativity between Si and oxygen or between Zr and oxygen. The electronegativity is 1.90 for Si, 1.33 for Zr, and 3.44 for oxygen. Accordingly, it can be understood that electrons in the molecule are localized on oxygen, which is attributable to the generation of the dipole-dipole interaction.

Then, description is to be made to SiTe and SiSb as the phase change material. Constituent elements of them have substantially the same electronegativity (Ge: 2.01, Sb: 2.05, Te: 2.10, Si: 1.90). Accordingly, it can be assumed that the dipole-dipole interaction is small and only the dispersion force is concerned between the material and pure water. Based on the assumption described above and from (equation 3) to (equation 5), the following relation can be obtained.

[Equation 6]

$$\gamma_i^d = \left[\frac{\gamma_w(1+\cos\theta_{iw})}{2\sqrt{\gamma_w^d}}\right]^2 \quad \text{(equation 6)}$$

As described above, when the angle of contact $\theta_{iw}$ is measured, $\gamma_i^d$, that is, $\gamma_i$ can be calculated. Based on the calculated values, the interfacial energy $\gamma_{i-PC}$ between the phase-change material and the interface layer material can be determined as:

[Equation 7]

$$\gamma_{i-PC} = \gamma_i + \gamma_{PC} - 2\sqrt{\gamma_i^d \gamma_{PC}^d} \quad \text{(equation 7)}$$

That is, the interfacial energy $\gamma_{i-PC}$ between the phase-change material and the interface layer material can be calculated by measuring the angle of contact between the thin film of a single material and pure water. The gist of the above consideration is that the interfacial energy between the phase-change material and the interface layer material can be determined approximately by measuring the surface energy based on the angle of contact with pure water as an intermediary.

FIG. 34B sets forth the result of measurement regarding the interfacial energy between the $Ge_2Sb_2Te_5$ phase-change material and the interface layer material. When considering the interfacial energy relative to the $Ge_2Sb_2Te_5$ phase-change material, since it was 7.13 $mJ/m^2$ for $SiO_2$ and 2.58 $mJ/m^2$ for $Cr_2O_3$, the surface energy at about 3 $mJ/m^2$ or less can be considered as a criterion for improving the crystallization of the phase-change material in the same manner as in the estimation in the case of the eutectic phase-change material described above.

Then, the problems in the use of the third material system and means for the solution thereof are to be described. In the case of the third material system, since the materials are generally insulators, they cannot satisfy the requirement of the electric conductivity described above as they are. The means for the solution is shown below.

Figure 35A:
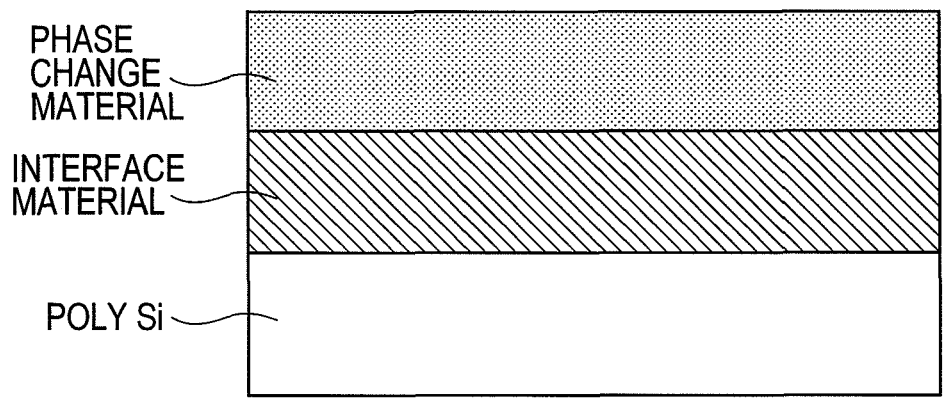
FIG. 35a shows a case of a thick interface layer and FIG. 35B shows a case of a thin, interface layer.
Figure 35B:
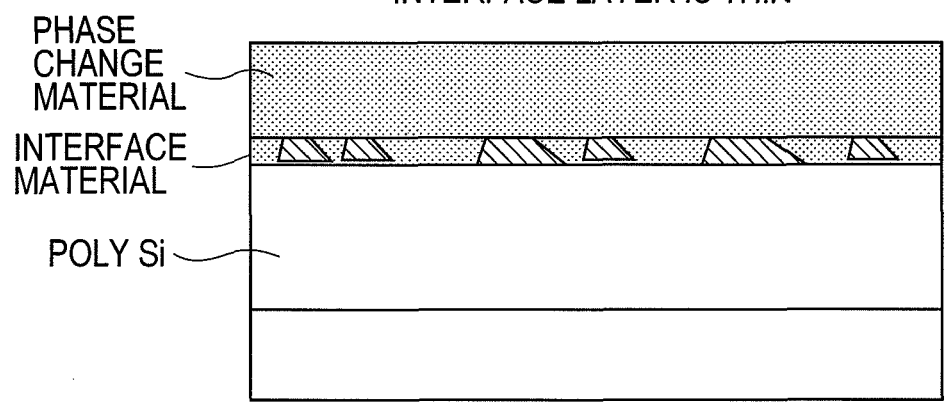

FIG. 35 shows an example of a structure for applying a metal oxide material to the interface layer. When the thickness of the metal oxide material is large as shown schematically in the drawing, the electric resistance is excessively high and it does not function as a memory device. Then, the thickness of the metal oxide material is reduced to about 0.2 to 2 nm and the layer is formed so as not to form a complete continuous film. As a result, the phase-change material deposited subsequently is in contact with the poly-Si material as the current channel. In this case, the electric resistivity of the interface layer can be controlled effectively depending on the ratio of the bonding area between the phase-change material and the poly-Si material. As described above, in a case of using the metal oxide, an interface layer satisfying the condition described above can be formed by selecting the film thickness thereof.

Based on the concept of controlling the electric conductivity by the selection of the film thickness, a metal nitride can also be used as the interface layer material of the invention. A fourth material system, in which the adhesiveness with Si and the phase-change material is taken into consideration in the same manner as described above, includes, for example, an Al—Ti—N system, an Al—Ta—N system, and an Al—Zr—N system.

As described above, the first to fourth material systems are shown as the interface layer material of the invention. When taking such material systems into consideration, it can be seen that suitable materials as the interface layer materials are those materials satisfying that: (1) a compound of at least about 1 atom layer is formed at the boundary between the interface layer material and the phase-change material layer, (2) the thickness of the compound is at such an extent as not hindering the crystallization of the phase-change material layer (specifically, the thickness of the compound is preferably ¼ or less to the thickness of the phase-change material layer, or 2 nm or less) and (3) the surface energy of the interface layer material and that of the phase-change material are close to each other (interfacial energy, 3 mJ/m$^2$ or less).

While examples of binary system/ternary system materials are shown as the interface layer material, it is a well-known technique to control melting point, electric conductivity, adhesiveness, etc. to appropriate levels by changing the composition and adding a third or fourth element to such material systems, and the control may be conducted optionally.

Further, this example provides an effect particularly in the case of the structure as in FIG. 1 and FIG. 2 since refinement can be proceeded by reducing the thickness of the phase-change material, it will be apparent that such an effect can also be obtained for other structures than those in FIG. 1 and FIG. 2 (for example, also in a case of reducing the thickness of the phase-change material layer in order to decrease the aspect ratio).

Example 3

Then, description is to be made to a recording method of suppressing cross-erase as a second object of the invention.

Figure 36A:
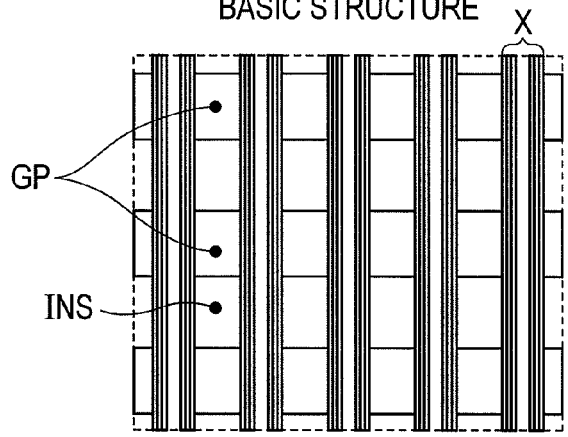
FIG. 36A is a schematic view for the structure shown in FIG. 2A.

FIG. 36A is a schematic view for the structure shown in FIG. 2A. GP corresponds to a gate poly silicon layer, which is isolated by an insulating film INS. Further, a member X is formed on the side wall of the gate polysilicon layer GP and the insulating film INS in which gate insulating film-channel portion (polysilicon channel)-phase-change material layer-insulating film-phase-change material layer-channel portion (polysilicon channel)-gate insulating film are disposed from the left. For the sake of simplicity of the description, thin interface layer thin film shown in FIG. 2 is not illustrated. In the invention described in Example 3, the interface layer film may or may not be present.

Then, as the lateral refinement is proceeded, since the aspect ratio becomes greater, the size in the vertical direction is also decreased. Then, a gap between the gate polysilicon layers GP is decreased. In this structure, information is stored in the phase-change material layer situated on the side of the gate polysilicon film GP. Accordingly, the distance between the positions of the phase-change material layers storing different bits respectively is narrowed. Since information is rewritten by applying heat to the phase-change material layer, as the distance between the adjacent bits is decreased, cross erase is generated under the effect of heat upon writing to adjacent cells. This problem occurs in the same manner also in the structure shown in FIG. 1.

Figure 36B:
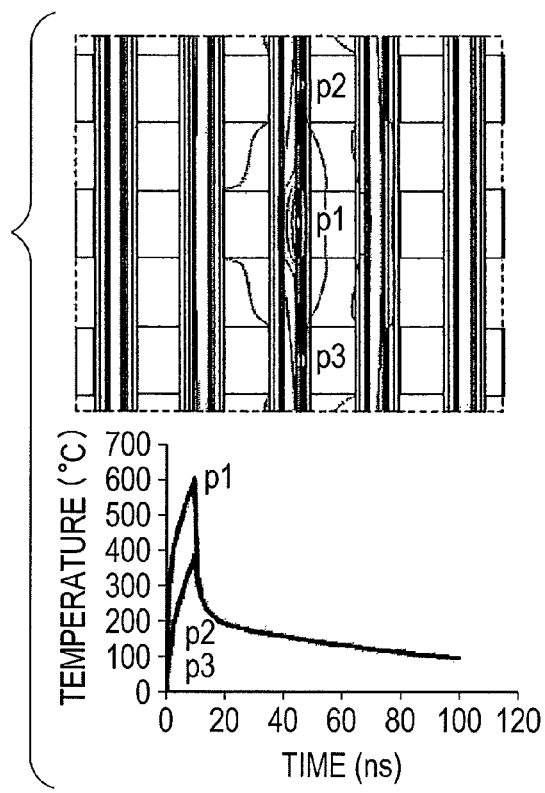
FIG. 36B shows a case of isotropic thermal conduction and FIG. 36C shows a case of anisotropic thermal conduction.
Figure 36C:
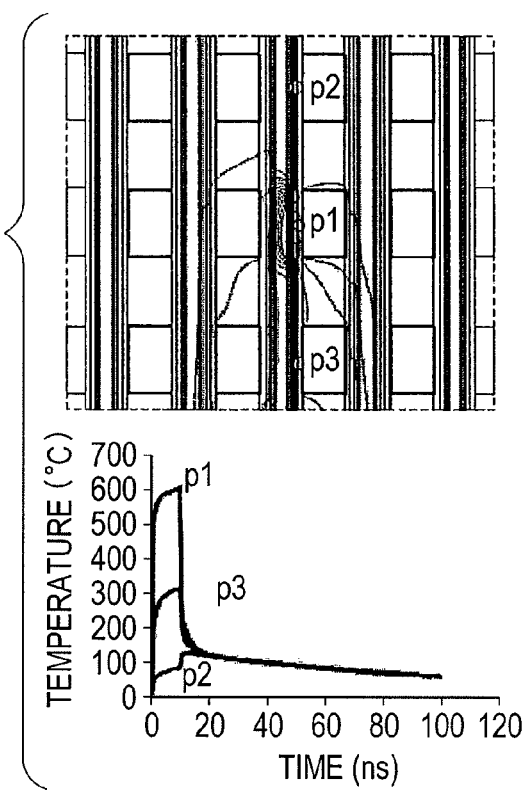

Then, anisotropy of the thermal conductivity of the Si channel is considered. As is well-known, the thermal conductivity of a metal material is approximated well through modeling on free electron gas approximation, for example, by a Drude model. For Si used for the channel, since substantially all free electrons are moved along the electric field during writing, it is considered that such free electrons (or holes) transport a heat energy as a kinetic energy. In this case, anisotropy of the thermal conductivity is generated along the current flowing direction. For the structure in FIG. 36A, a difference between a case of isotropic thermal conduction and a case with 10% anisotropy is determined by simulation. FIG. 36B shows a case of isotropic thermal conduction and FIG. 36C shows a case with 10% anisotropy. It is assumed here that the anisotropy of the thermal conductivity develops only in the duration in which write current pulses are applied. Further, this shows a case where electrons act as carriers and electrons flow from above to below in FIG. 36A. As shown in the drawing, the temperature hysteresis is identical between the upstream (P2) and the downstream (P3) in the case of anisotropic heat conduction as shown in FIG. 36B. On the other hand, also in a case where a small 10% anisotropy is contained, it can be seen that the temperature at the downstream (P3) becomes remarkably higher compared with that at the upstream (P2) of electron flow during writing for a center bit (P1) as shown in FIG. 36C.

Then, in this example, writing is conducted orderly from the upstream to the downstream of the flow of carriers. This can suppress cross erase to the upstream. In this case, while cross erase occurs at the downstream of the data inputted in correspondence to one write command, this causes no problem since a new data is to be written.

Figure 37:
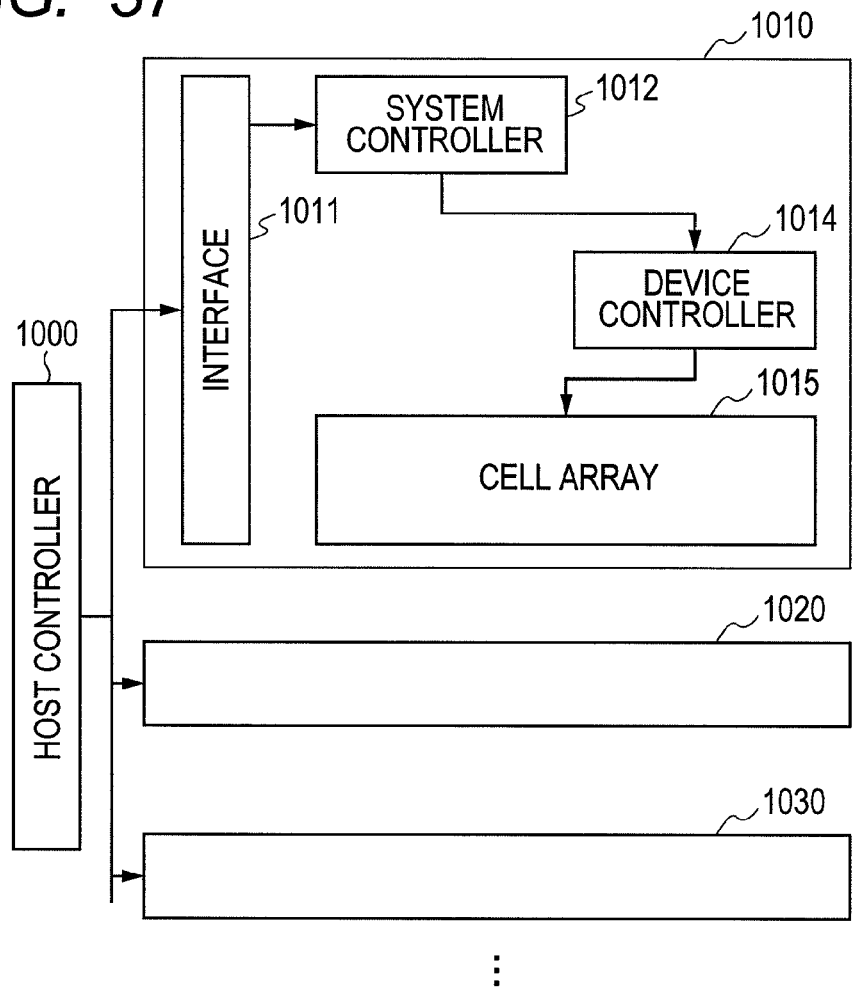
FIG. 37 is a system block diagram in Example 3 of the invention.

FIG. 37 shows a block diagram for the constitution of the memory system that attains the writing method. A plurality of memory chips 1010, 1020, 1030, - - - are connected to a host controller 1000 to form a memory system. The inside of the memory chip 1010 includes an interface 1011, a chip controller 1012, a device controller 1014, and a cell array 1015. A plurality of memory devices as shown in FIG. 1 or 2 are incorporated inside the cell array 1015.

In the structure described above, a flow of writing data to the cell array 1015 is shown below. A data write command and a write data from the host controller 1000 are sent by way of the interface 1011 to the chip controller 1012. Upon receiving the write command, the chip controller 1012 instructs the device controller 1014 to conduct writing and transfers the write data. The device controller 1014 has a buffer and temporarily holds the write data transferred from the chip controller 1012. Further, the device controller 1014 generates a physical address to write a row of data temporarily held in the buffer from an instructed logic address by the instruction of the chip controller 1012, and executes current pulse control or the like for writing the data to the row of physical address in the cell array 1015. In this case, the device controller 1014 sets up the gate polysilicon layer GP situated at the upstream of carriers and writes the data held in the buffer. Then, it successively sets up the gate polysilicon layers GP toward the downstream and controls so as to write the write data held in the buffer.

As described above, the device controller 1014 allocates a plurality of bits arranged in the vertical direction (plurality of bits using a common phase-change material layer) to one row of data and conducts writing successively from the upstream where the carriers flow, thereby capable of suppressing cross erase. For the specific method of writing from the upstream where the carriers flow, various other methods may be considered in addition to the method described above. For example, a plurality of bits arranged in the vertical direction are adapted as a unit to be invalidated (erased) collectively and the device controller may conduct control so as to select a gate polysilicon layer GP at the upstream relative to the flow of carriers when a first write command is inputted after the invalidation and then select gate polysilicon layers GP at the downstream successively on every input of the write commands. In this case, while it may be a possibility of making the administration of the physical address complicate, the write time can be shortened since it is not necessary to repeat write operations for one command.

It will be understood easily that the signs are reversed relative to the direction of the current flow between a case where the carriers are free electrons and the case where the carriers are holes.

Example 4

Figure 38:
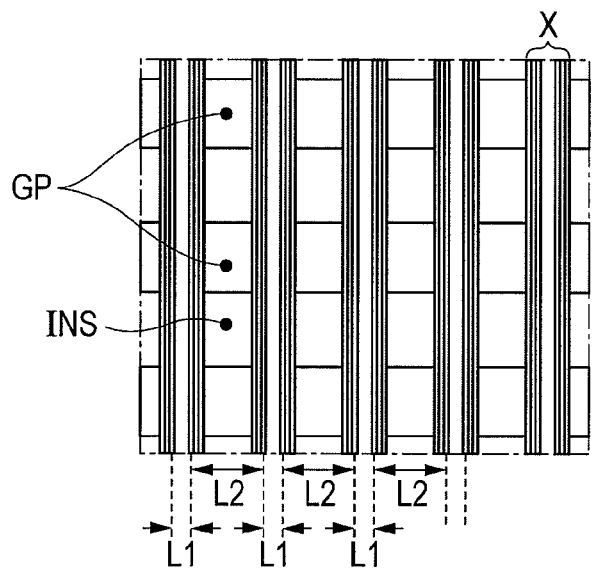
FIG. 38 is an explanatory view for the lateral cross erase in the lateral direction.

Then, cross erase in the lateral direction is to be investigated. In the phase-change memory of the vertical memory structure shown in FIG. 2, since the memory bit portions are formed in a three-dimensional manner and the polysilicon channel and the phase-change material are formed in one hole, the distance between the memory bits for the lateral direction are: -L1-L2-L1-L2 as shown in FIG. 38. Since L1<L2 in this case, close erase in the lateral direction is worst between two adjacent bits with the memory bit distance of L1, that is, between opposed memory bits shown in FIG. 2 and FIG. 38. This is worst particularly in a case of forming both of the opposed memory bits into the amorphous state that requires heat. This can be avoided by writing data under modulation such that both of two opposed memory bits are not in the amorphous state simultaneously. For example, assuming the amorphous state as bit "1" and the crystalline state as bit "0", the states may be restricted to three combinations, that is, "00", "01" and "10" for two bits adjacent at the distance L1. It is possible to decrease the cross erase and provide a phase-change memory of high reliability by using such a modulation code.

Figures 39, 40:
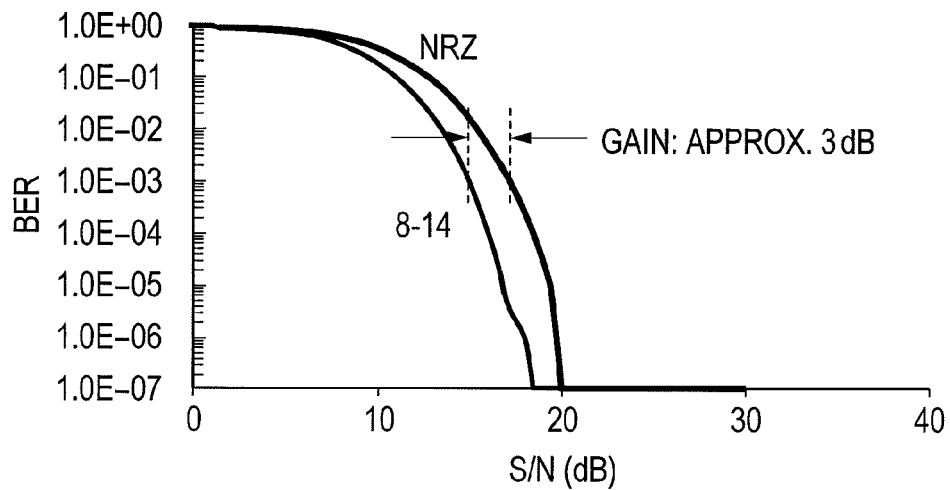
FIG. 39 shows a relation between the number of 1's in 8-14 modulation code and the number of patterns thereof.
FIG. 40 is a graph showing the effect of improving the error rate by the modulation code.

Then, a modulation code for suppressing the cross erase is to be described specifically. An example of a code that represents an 8-bit data by conversion to a 14-bit data is shown and this is referred to as 8-14 modulation. FIG. 39 shows a relation arranged between the number of 1's included in a 14-bit modulation code and the number of patterns thereof. The number of patterns is calculated for those satisfying the condition that opposed bits are not in "11" state. Since the calculation method is well-known to usual engineers having a knowledge concerning the code rule, details therefore are not described. In this case, when the number of 1's is, for example, 3, the number of patterns that can be taken is 280. When the number of patterns is 256 or more, the 8-bit data can be represented by coding. By using the method, cross erase can be suppressed since both of adjacent bits suffering from most stringent cross erase are not in the amorphous state, that is, the "11" state simultaneously.

FIG. 40 shows the result of calculation for determining a relation between the S/N ratio and the byte error ratio when using an 8-14 modulation code. The noise type is assumed as random noise in this case. As shown in the graph, it can be seen that an extremely high S/N gain of about 3 dB can be obtained by using the modulation code. Further, in a case where the number of 1's in the code is determined, demodulation can be conducted by judging bits of a predetermined number (three in the example described above) sequentially from those of higher resistance as "1". The reading method is effective as a judging method that automatically traces the case where the electric resistivity of the phase-change material changes greatly depending on the temperature and the electric field strength as described above.

Figure 41:
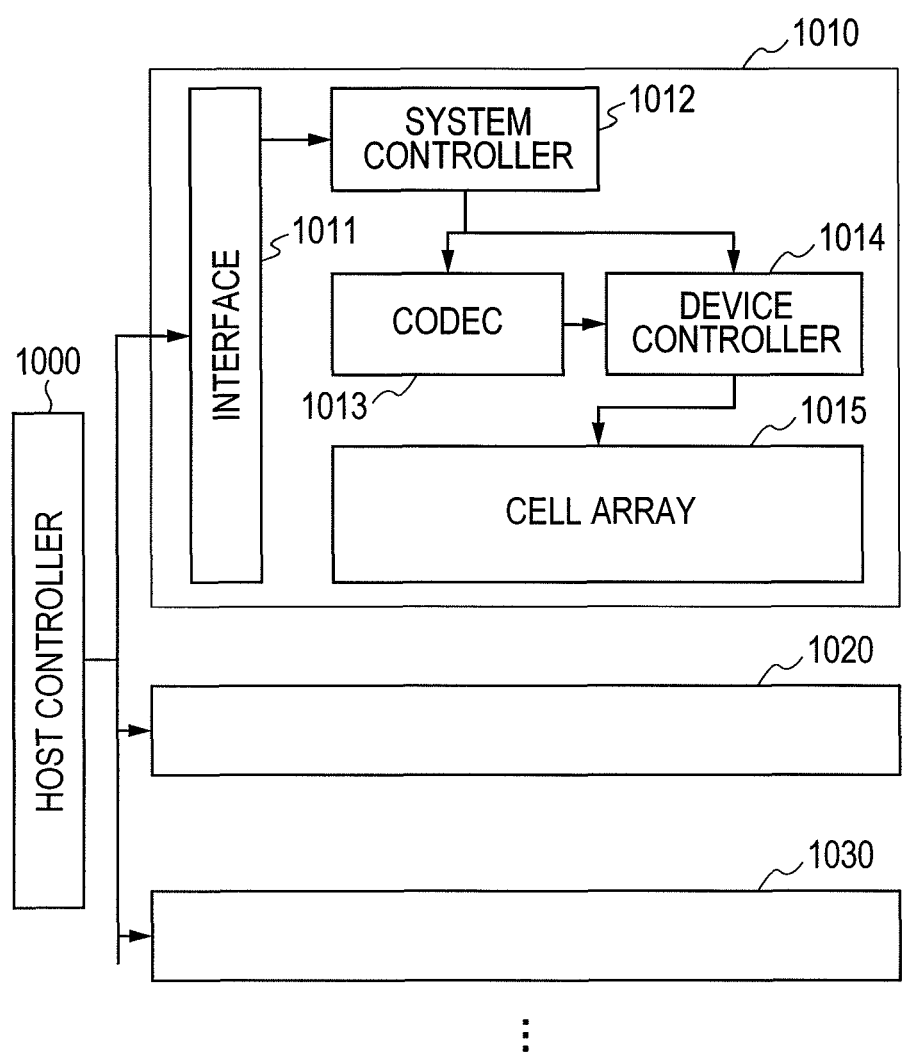
FIG. 41 is a system block diagram in Example 4 of the invention.

FIG. 41 is a block diagram showing the constitution of a memory system when a 8-14 modulation code is used. This constitution is different from that of FIG. 37 in that a codec 1013 is added. Further, a plurality of memory devices as shown in FIG. 2 are incorporated inside the cell array 1015.

In the constitution described above, a flow of recording data into the cell array 1015 by using a modulation method of this example is shown below. A data write command from the host controller 1000 is sent by way of an interface 1011 to a chip controller 1012. Based on the instruction from the chip controller 1012, the codec 1013 modulates the data to be written based on a modulation code rule.

The device controller 1014 generates a physical address to write a row of modulated data from an instructed logic address by the instruction of the chip controller 1012, and executes current pulse control or the like for writing the data to the row of the physical address in the cell array 1015. The data read out is executed by executing the sequence described above in the opposite direction.

Further, the modulation method in Example 4 can be realized by combination with the writing method in Example 3. In this case, since the cross erase in the vertical direction and the lateral direction can be suppressed, a semiconductor device of high reliability can be realized. Needless to say, the writing methods in Example 3 and Example 4 can be applied independently.

What is claimed is:
1. A semiconductor memory device, comprising:
a stack in which a plurality of inter-gate insulating layers and a plurality of gate layers are stacked alternately,
a channel layer formed along the lateral side of the stack,
an interface layer formed along the lateral side of the channel layer, and
a phase-change material layer formed along the lateral side of the interface layer,
wherein the thermal conductivity of the interface layer is lower than the thermal conductivity of the channel layer, wherein the electric resistivity of the interface layer is higher than the electric resistivity of the phase-change material layer in the crystalline state,
wherein the interface layer forms a compound at a boundary with the phase-change material layer, and
wherein the thickness of the compound is ¼ or less for the thickness of the phase-change material layer, or 2 nm or less.

2. The semiconductor memory device according to claim 1, wherein the thermal conductivity of the interface layer is 1/10 or lower of the thermal conductivity of the channel layer, and
wherein the electric resistivity of the interface layer is three times or higher of the electric resistivity of the phase-change material layer in the crystalline state.

3. The semiconductor memory device according to claim 1, wherein the melting point of the interface layer is higher than the melting point of the phase-change material layer.

4. The semiconductor memory device according to claim 1, wherein the interface layer is one of an alloy system of Si and chalcogenide, a material system in which an oxide thereof forms a compound at the boundary relative to the phase-change material layer and oxygen of the oxide is substituted by Te, a metal oxide having an interfacial energy of 3 $mJ/m^2$ or less, and a metal nitride having an interfacial energy 3 $mJ/m^2$ or less.

5. The semiconductor memory device according to claim 4, wherein the thickness of the phase-change material layer is less than 4 nm.

6. A semiconductor memory device, comprising:
a stack in which a plurality of inter-gate insulating layers and a plurality of gate layers are stacked alternately;
a channel layer formed along the lateral side of the stack;
an interface layer formed along the lateral side of the channel layer; and
a phase-change material layer formed along the lateral side of the interface layer,
wherein the thermal conductivity of the interface layer is 1/10 or lower of the thermal conductivity of the channel layer,
wherein the electric resistivity of the interface layer is three times or higher of the electric resistivity of the phase-change material layer in the crystalline state, and
wherein the electric resistivity of the interface layer is 10,000 times or lower of the electric resistivity of the phase-change material layer in the amorphous state.

7. A semiconductor memory device, comprising:
a stack in which a plurality of inter-gate insulating layers and a plurality of gate layers are stacked alternately;
a channel layer formed along the lateral side of the stack;
an interface layer formed along the lateral side of the channel layer;
a phase-change material layer formed along the lateral side of the interface layer; and
a portion where the channel layer and the phase-change material layer are in contact to each other in a case where the interface layer is the metal oxide or the metal nitride,
wherein the thermal conductivity of the interface layer is lower than the thermal conductivity of the channel layer,
wherein the electric resistivity of the interface layer is higher than the electric resistivity of the phase-change material layer in the crystalline state, and
wherein the interface layer is one of an alloy system of Si and chalcogenide, a material system in which an oxide thereof forms a compound at the boundary relative to the phase-change material layer and oxygen of the oxide is substituted by Te, a metal oxide having an interfacial energy of 3 $mJ/m^2$ or less, and a metal nitride having an interfacial energy 3 $mJ/m^2$ or less.

8. A semiconductor memory device, comprising:
a phase-change material layer at a thickness of less than 4 nm; and
an interface layer comprising one of alloy systems of Si and chalcogenide, a material system in which an oxide thereof forms a compound at the boundary relative to the phase-change material layer and oxygen of the oxide is substituted by Te, a metal oxide having an interfacial energy of 3 $mJ/m^2$ or less, and a metal nitride having an interfacial energy 3 $mJ/m^2$ or less,
wherein the interface layer forms a compound at a boundary with the phase-change material layer, and
wherein the thickness of the compound is ¼ or less for the thickness of the phase-change material layer, or 2 nm or less.

9. The semiconductor memory device according to claim 8, further comprising a channel layer formed along the interface layer and a portion where the channel layer and the phase-change material layer are in contact to each other in a case where the interface layer is the metal oxide or the metal nitride.

* * * * *